United States Patent
Kwon et al.

(10) Patent No.: US 9,754,660 B2
(45) Date of Patent: Sep. 5, 2017

(54) SEMICONDUCTOR DEVICE

(71) Applicant: SAMSUNG ELECTRONICS CO., LTD., Suwon-si, Gyeonggi-Do OT (KR)

(72) Inventors: Dae-Jin Kwon, Seongnam-si (KR); Kang-Ill Seo, Chungcheongbuk-Do (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 14/946,258

(22) Filed: Nov. 19, 2015

(65) Prior Publication Data
US 2017/0148505 A1  May 25, 2017

(51) Int. Cl.
*H01L 27/11* (2006.01)
*G11C 11/419* (2006.01)

(52) U.S. Cl.
CPC ............ *G11C 11/419* (2013.01); *H01L 27/11* (2013.01)

(58) Field of Classification Search
CPC .............................. H01L 27/11; G11C 11/419
See application file for complete search history.

(56) References Cited

U.S. PATENT DOCUMENTS

| | | |
|---|---|---|
| 5,953,283 A | 9/1999 | Meltzer et al. |
| 6,084,820 A | 7/2000 | Raszka |
| 6,477,080 B2 | 11/2002 | Noble |
| 6,773,994 B2 | 8/2004 | Chittipeddi et al. |
| 7,052,941 B2 | 5/2006 | Lee |
| 7,138,685 B2 | 11/2006 | Hsu et al. |
| 8,343,814 B2 | 1/2013 | Bucki et al. |
| 8,890,240 B2 | 11/2014 | Ng et al. |
| 9,048,255 B2 | 6/2015 | Ng et al. |
| 2007/0007601 A1 | 1/2007 | Hsu et al. |
| 2014/0015047 A1 | 1/2014 | Ng et al. |
| 2014/0269022 A1 | 9/2014 | Xie et al. |

FOREIGN PATENT DOCUMENTS

| | | |
|---|---|---|
| JP | 2004193588 | 7/2004 |
| JP | 2013102193 | 5/2013 |
| KR | 1020040051506 | 6/2004 |
| KR | 1020140008232 | 1/2014 |

*Primary Examiner* — Douglas Menz
(74) *Attorney, Agent, or Firm* — F. Chau & Associates, LLC

(57) ABSTRACT

Provided are a semiconductor device. The semiconductor device includes an SRAM cell including a first pull-up transistor, a first pull-down transistor and a first pass transistor formed on a substrate, a first read buffer transistor connected to gate terminals of the first pull-up transistor and the first pull-down transistor, and a second read buffer transistor which shares a drain terminal with the first read buffer transistor, wherein the first read buffer transistor includes a first channel pattern extending in a first direction vertical to an upper surface of the substrate, a first gate electrode which covers a part of the first channel pattern, and a first drain pattern which does not contact the first gate electrode, and which extends in the first direction, and which is electrically connected to the first channel pattern.

9 Claims, 25 Drawing Sheets

1400

SEMICONDUCTOR DEVICE

TECHNICAL FIELD

The present inventive concept relates to a semiconductor device.

DISCUSSION OF THE RELATED ART

Static random access memories (SRAMs) may be divided into six transistor SRAMs (6T-SRAMs) including six transistors to constitute a unit memory cell, and multi-port SRAMs having a plurality of input/output ports including six or more transistors. Multi-port SRAMs may include two-port SRAMs (dual-port SRAMs), for example.

SUMMARY

According to an exemplary embodiment of the present inventive concept, a semiconductor device provided as follows. An SRAM cell includes a first pull-up transistor, a first pull-down transistor and a first pass transistor disposed on a substrate. A first read buffer transistor is connected to gate terminals of the first pull-up transistor and the first pull-down transistor. The first read buffer transistor includes a first channel pattern extending in a first direction vertical to an upper surface of the substrate, a first gate electrode covering a part of the first channel pattern, and a first drain pattern as a drain terminal of the first read buffer transistor. The drain pattern is spaced apart from the first gate electrode, extended in the first direction, and connected electrically to the first channel pattern. A second read buffer transistor has the first drain pattern as a drain terminal of the second read buffer transistor.

According to an exemplary embodiment of the present inventive concept, a semiconductor device is provided as follows. A first pull-up transistor is formed on a substrate. A first pull-down transistor is connected in series to the first pull-up transistor. The first pull-up transistor and the first pull-down transistor shares a drain terminal. A first pass transistor is connected to the drain terminal of the first pull-up transistor. The first pass transistor includes a first channel pattern extending in a first direction vertical to an upper surface of the substrate, a first gate electrode covering a part of the first channel pattern, and a first drain pattern as a drain terminal of the first pass transistor. The first drain pattern is spaced apart from the first gate electrode, extended in the first direction, and connected electrically to the first channel pattern. A second pass transistor shares the first drain pattern of the first pass transistor as a drain terminal of the second pass transistor. The first pass transistor and the second pass transistor are connected to a first word line and a second word line, respectively.

According to an exemplary embodiment of the present inventive concept, a semiconductor device is provided as follows. An SRAM circuit includes a latch circuit including a first inverter and a second inverter, a first pass transistor connected to the first inverter, and a second pass transistor connected to the second inverter. A first transistor is connected to the first inverter. At least one of the first pass transistor and the first transistor includes a first channel pattern extending in a first direction vertical to an upper surface of a substrate and including first to third parts, the first to third parts being vertically arranged from the substrate, a first gate electrode covering the second part and extended in a second direction different from the first direction, and a first drain pattern spaced apart along the second direction from the first gate electrode, extended in the first direction, and connected electrically to the first part.

According to an exemplary embodiment of the present inventive concept, a semiconductor device is provided as follows. A storage cell includes a first inverter having a first pull-up transistor and a first pull-down transistor and a second inverter having a second pull-up transistor and a second pull-down transistor. A first pass transistor has a drain terminal coupled to a drain terminal of the first pull-up transistor, a drain terminal of the first pull-down transistor, a gate terminal of the second pull-up transistor and a gate terminal of the second pull-down transistor. The drain terminals of the first pass transistor, the first pull-down transistor and the first pull-up transistor include a first drain pattern shared by the first pass transistor, the first pull-down transistor and the first pull-up transistor. A second pass transistor has a drain terminal coupled to a gate terminal of the first pull-up transistor, a gate terminal of the first pull-down transistor, a drain terminal of the second pull-up transistor and a drain terminal of the second pull-down transistor. The drain terminals of the second pass transistor, the second pull-down transistor and the second pull-up transistor include a second drain pattern shared by the second pass transistor, the second pull-down transistor and the second pull-up transistor. A bit line is coupled to a source terminal of the first pass transistor. A complementary bit line is coupled to a source terminal of the second pass transistor.

BRIEF DESCRIPTION OF THE DRAWINGS

These and other features of the inventive concept will become more apparent by describing in detail exemplary embodiments thereof with reference to the accompanying drawings of which.

Figure 1:
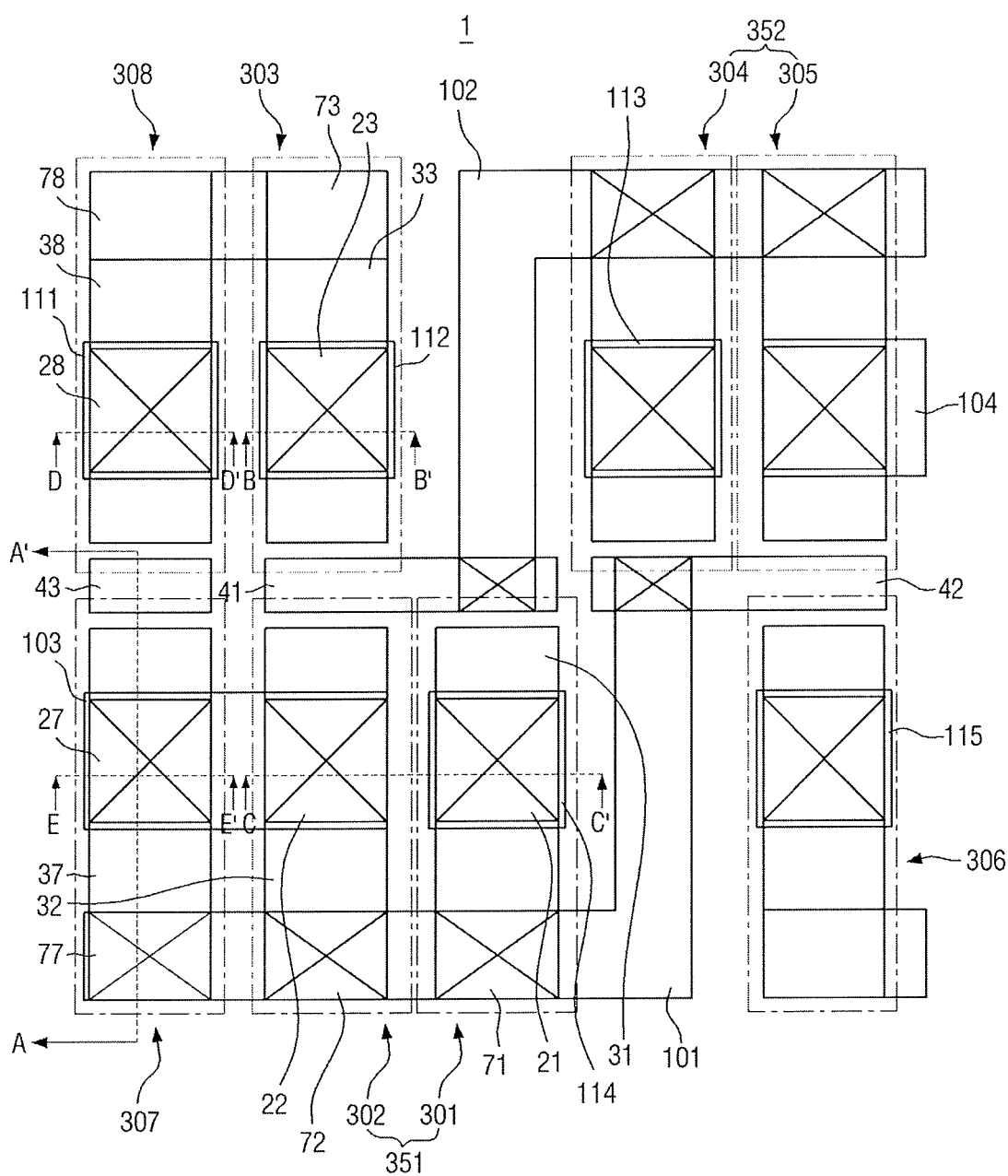
FIG. 1 is a layout diagram of a semiconductor device according to an exemplary embodiment of the present inventive concept.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

DETAILED DESCRIPTION OF THE EMBODIMENTS

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

Semiconductors according to some embodiments of the present inventive concept will be hereinafter described with reference to FIG. 1 to FIG. 25.

Figure 2:
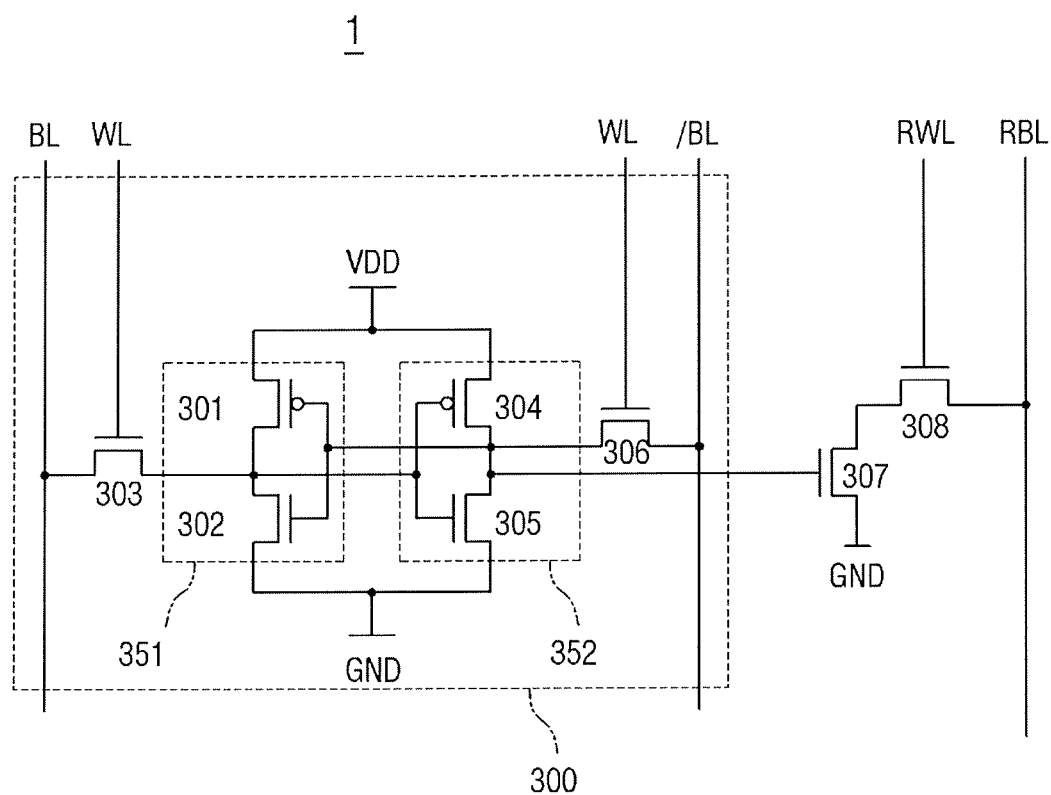
FIG. 2 is a circuit diagram of the semiconductor device of FIG. 1.
Figure 3:
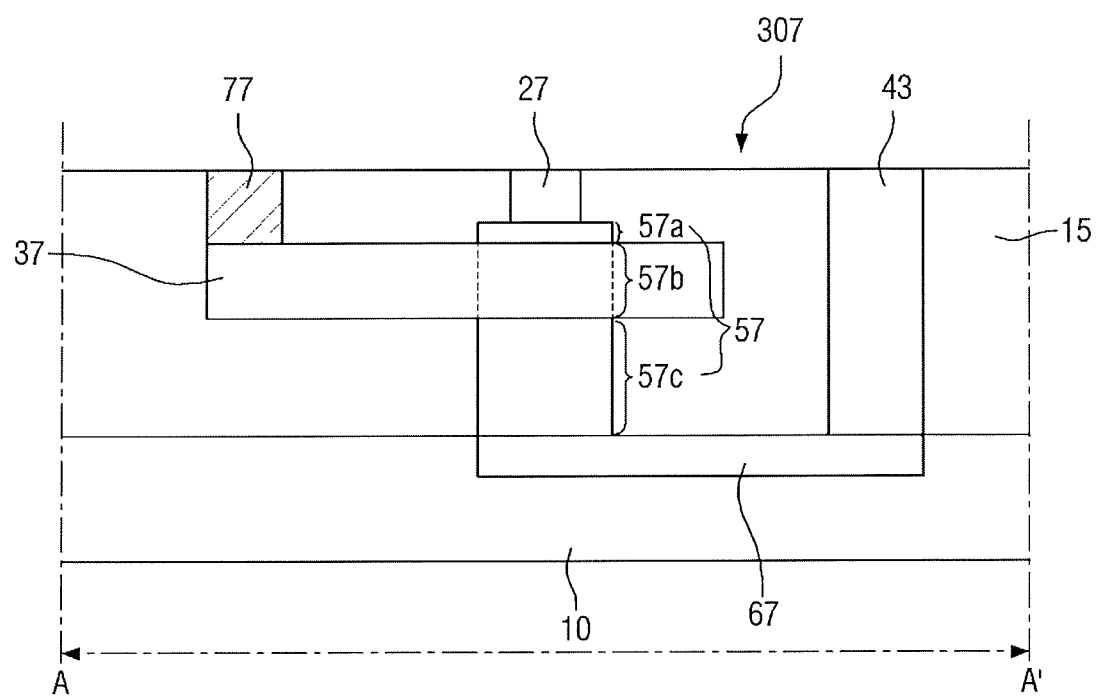
FIG. 3 is a cross-sectional view taken along line A-A' of FIG. 1.

FIG. 1 is a layout diagram of a semiconductor device according to an exemplary embodiment of the present inventive concept. FIG. 2 is a circuit diagram of the semiconductor device having the layout of FIG. 1. FIG. 3 is a cross-sectional view taken along the line A-A' of FIG. 1.

For convenience of description, FIG. 1 does not show a read bitline RBL, a bitline BL, a power node (VDD), a complimentary bitline (/BL), first and second wordlines (RWL, WL), a ground node (GND) and contacts connected thereto.

Referring to FIGS. 1 to 3, a semiconductor device 1 according to an exemplary embodiment of the present inventive concept may include an SRAM cell 300.

The SRAM cell 300 may include a first inverter 351, a second inverter 352, a first pass transistor 303 and a second pass transistor 306. The SRAM cell 300 may be formed on a substrate.

The substrate 10 may be, for example, a bulk silicon substrate or a silicon-on-insulator (SOI). Alternatively, the substrate 10 may be a silicon substrate, or include other materials, for example, silicon germanium, indium antimonide, lead telluride, indium arsenide, indium phosphide, gallium arsenide or gallium antimonide. Alternatively, the substrate 10 may be obtained by forming an epitaxial layer on a base substrate. For the convenience of description, it is assumed that the substrate 10 may be a silicon substrate.

The first inverter 351 and the second inverter 352 may be connected between the power node VDD and the ground node GND. The first inverter 351 may include a first pull-up transistor 301 and a first pull-down transistor 302 connected in series. Likewise, the second inverter 352 may include a second pull-up transistor 304 and a second pull-down transistor 305 connected in series.

The first pull-up transistor 301 and the second pull-up transistor 304 may be a p-type metal-oxide-semiconductor (PMOS) transistor, and the first pull-down transistor 302 and the second pull-down transistor 305 may be an n-type metal-oxide-semiconductor (NMOS) transistor.

The first inverter 351 and the second inverter 352 may be cross-coupled to each other to form a latch circuit. For example, an input node of the first inverter 351 is connected to an output node of the second inverter 352, and an input node of the second inverter 352 is connected to an output node of the first inverter 351.

The first pass transistor 303 and the second pass transistor 306 may be connected to the output nodes of the inverters 351 and 352, respectively. For example, the first pass transistor 303 may be connected between the output node of the first inverter 351 and the bitline BL, and the second pass transistor 306 may be connected between the output node of the second inverter 352 and the complementary bitline/BL. Gate terminals of the first pass transistor 303 and the second pass transistor 306 may be connected to the wordline WL.

Furthermore, the semiconductor device 1 of the present inventive concept may further include a first read buffer transistor 307 and a second read buffer transistor 308. A gate of the first read buffer transistor 307 may be connected to the input node of the first inverter 351 and the output node of the second inverter 352. The first read buffer transistor 307 may be connected between the ground node and the second read buffer transistor 308. The second read buffer transistor 308 may be connected between the first read buffer transistor 307 and the read bitline RBL. A gate of the second read buffer transistor 308 may be connected to the read wordline RWL. In this case, the first read buffer transistor 307 and the second read buffer transistor 308 may include a transistor having a vertical structure which will be explained in more detail later.

As the first read buffer transistor 307 and the second read buffer transistor 308 are added, the semiconductor device 1 of the present inventive concept may operate as a two-port SRAM having a read port and a write port which are separated from each other. Thus, the semiconductor device 1 of the present inventive concept may overcome the problem of tradeoff between a disturb margin and a write margin that is inherent to conventional SRAMs including only six transistors.

In this case, the semiconductor device 1 of the present inventive concept may operate in a read mode and a write mode separately from each other. In this case, the semiconductor device 1 may be referred to as a dual-port memory. In a read mode, the read wordline RWL and the read bitline RBL connected to the second read buffer transistor 308 may be activated to read the value stored in the SRAM cell 300. In a write mode, the wordline WL, the bitline BL and the complementary bitline /BL connected to the first pass transistor 303 and the second pass transistor 306 may be activated to store data in the SRAM cell 300. However, the present inventive concept is not limited thereto.

The first pass transistor 303 and the first inverter 351 may share a first drain pattern 41. For example, the first pass transistor 303 and the first inverter 351 may share the first drain pattern 41 as a common drain terminal, thereby reducing the area of the semiconductor device 1. In this case, the first pass transistor 303 may be arranged at one side of the first drain pattern 41 and the first pull-up transistor 301 and the first pull-down transistor 302 may be arranged at the other side of the first drain pattern 41. However, the present inventive concept is not limited thereto.

Similarly, the second pass transistor 306 and the second inverter 352 may share a second drain pattern 42. For example, the second drain pattern 42 is shared as a common drain terminal, thereby reducing the area of the semiconductor device 1. In this case, the second pull-up transistor 304 and the second pull-down transistor 305 may be arranged at one side of the second drain pattern 42, and the second pass transistor 306 may be arranged at the other side of the second drain pattern 42. However, the present inventive concept is not limited thereto.

In this case, the first drain pattern 41 and the second drain pattern 42 may be arranged in a straight line. For example, the second drain pattern 42 may be disposed on a straight line region to which the first drain pattern 41 extends.

The output terminal of the first inverter 351 may be connected to the second drain pattern 42 through a first node contact 101. The output terminal of the second inverter 352 may be connected to the first drain pattern 41 through a second node contact 102.

Furthermore, the first read buffer transistor 307 and the second read buffer transistor 308 may share a third drain pattern 43. For example, the first read buffer transistor 307 may include the third drain pattern 43, and the second read buffer transistor 308 may use the third drain pattern 43 as a drain terminal. For example, the third drain pattern 43 may be shared as a common drain terminal and formed neighboring the SRAM cell 300, thereby minimizing an increase in the area of the semiconductor device 1 caused due to the use of additional transistors 307 and 308. In this case, the first read buffer transistor 307 may be arranged at one side of the third drain pattern 43, and the second read buffer transistor 308 may be arranged at the other side of the third drain pattern 43. However, the present inventive concept is not limited thereto.

In this case, the third drain pattern 43, the first drain pattern 41 and the second drain pattern 42 may be disposed in a straight line. For example, the first drain pattern 41 and the second drain pattern 42 may be disposed on a straight line region to which the third drain pattern 43 extends. However, the present disclosure is not limited thereto.

Referring to FIG. 3, the first read buffer transistor 307 may be formed on the substrate 10, including an interlayer insulating layer 15, a first source pattern 27, a first gate electrode 37, a first channel pattern 57, the third drain pattern 43 and a first conductive region 67.

The first channel pattern 57 may a vertical channel, extending in a first direction vertical to the substrate 10. The first channel pattern 57 may be divided into a first part 57c, a second part 57b and a third part 57a in the order of proximity to an upper surface of the substrate 10.

The first channel pattern 57 may be shaped as a rectangular pillar, but the present inventive concept is not limited thereto. For example, the first channel pattern 57 may have an upper surface shaped as a circle.

The second part 57b may be overlapped with the first gate electrode 37 to form a channel region in the second part 57b. When a voltage equal to or higher than a threshold voltage is applied to the first gate electrode 37, the channel region of the first read buffer transistor 307 may be formed in the second part 57b.

In an exemplary embodiment, the first gate electrode 37 may have a gate-all-around structure wherein the second part 57b is wrapped around by the first gate electrode 37. In this case, a channel region may be formed on all surfaces at which the second part 57b and the first gate electrode 37 overlap each other to increase a channel width of the first read buffer transistor 307.

The third part 57a may be doped with impurities, thereby forming an impurity region therein. The third part 57a in which the impurity region is formed may have a source region formed therein.

As the first read buffer transistor 307 may be an NMOS transistor, the first channel pattern 57 may be formed of a tensile stress material. For example, when the substrate 10 is formed of Si, the first channel pattern 57 may be formed of Si or a material (for example, SiC) having a lattice constant smaller than that of Si. The tensile stress material may apply tensile stress to the channel region to increase carrier mobility in the channel region.

A first source pattern 27 may be formed on the first channel pattern 57. The first source pattern 27 may electrically connect the first channel pattern 57 and the ground node GND. However, the present inventive concept is not limited thereto.

The first source pattern 27 may include a conductive material. For example, the first source patter 27 may include, for example, at least one of polycrystalline silicon, a metal silicide compound, a conductive metal nitride and metal, but the present inventive concept is not limited thereto.

The first gate electrode 37 may be connected to the first channel pattern 57, and extended in a second direction intersecting the first direction. For example, the second direction may be parallel with the upper surface of the substrate 10. However, the present disclosure is not limited thereto.

For example, the first gate electrode 37 may be connected to the second part 57b of the first channel pattern 57. When the first gate electrode 37 is connected to the second part 57b, and a voltage equal to or higher than a threshold voltage is applied to the first gate electrode 37, a channel may be formed on the second part 57b.

The first gate electrode 37 may include a conductive material. For example, the first gate electrode 37 may include metal having high conductivity, but the present inventive concept is not limited thereto. For example, the gate electrode may be formed of non-metal such as poly silicon. For example, the first gate electrode 37 may be formed of doped polysilicon, titanium nitride (TiN), tantalum nitride (TaN), tungsten nitride (WN), titanium (Ti), tantalum (Ta), tungsten (W) and the like, but the present inventive concept is not limited thereto.

The first gate electrode 37 may wrap around the second part 57b to form a gate-all-around structure enclosing the second part 57b and a channel formed therein.

A first gate pattern 77 may be formed on the first gate electrode 37. The first gate pattern 77 may electrically connect the first gate electrode 37 and the input node of the first inverter 351 and the output node of the second inverter 352. [Note to client] However, the present inventive concept is not limited thereto.

The first gate pattern 77 may include a conductive material. For example, the first gate pattern 77 may include, for example, at least one of polycrystalline silicon, a metal silicide compound, a conductive metal nitride and metal, but the present inventive concept is not limited thereto.

The first gate electrode 37 may form a gate-all-around structure, and all surfaces of the second part 57b may be used as a channel region of the first read buffer transistor 307.

Although not shown in detail and clearly, a gate insulating layer and/or an interface layer may be interposed between the first gate electrode 37 and the second part 57b. For example, the gate insulating layer may be formed of a dielectric material. For example, the gate insulating layer may be formed of, for example, $HfO_2$, $Al_2O_3$, $ZrO_2$ or $TaO_2$, but the present inventive concept is not limited thereto.

An interface layer may be further interposed between the gate insulating layer and the second part 57b to prevent interface failure between the gate insulating layer and the second part 57b. The interface layer may include a low dielectric constant material having a dielectric constant (k) of around 9, for example, a silicon oxide layer (wherein, k is approximately 4) or a silicon oxynitride layer (wherein, k is approximately 4 to 8 depending on the content of oxygen atom or nitrogen atom). Furthermore, the interface layer may be formed of silicate or a combination of aforementioned layers.

The third drain pattern 43 may extend from the substrate 10 in the first direction, and the third drain pattern 43 may be formed of a material substantially the same as those of the first channel pattern 57. The third drain pattern 43 may be spaced apart from the first channel pattern 57. Furthermore, the third drain pattern 43 may be not overlapped with or in contact with the first gate electrode 37.

Meanwhile, the third drain pattern 43 may include an impurity region doped with impurities. The third drain pattern 43 having the impurity region formed therein may include the drain region of the first read buffer transistor 307.

The first conductive region 67 may electrically connect the first part 57c of the first channel pattern 57 and the third drain pattern 43. The first conductive region 67 may be formed in the substrate 10, being in contact with a lower surface of the first channel pattern 57 and a lower surface of the third drain pattern 43. The first conductive region 67 may be disposed to be in parallel with the first gate electrode 37, but the present inventive concept is not limited thereto.

The first conductive region 67 may include a conductive material. For example, the conductive material may include, for example, at least one of polycrystalline silicon, a metal silicide compound, a conductive metal nitride and metal, but the present inventive concept is not limited thereto.

The transistor structure having a vertical channel may be applied to the first read buffer transistor 307 and/or the second read buffer transistor 308. Furthermore, the transistor structure having a vertical channel described above may also be applied to the transistors included in the SRAM cell (for example, first and second pull-up transistors 301 and 304, first and second pull-down transistors 302 and 305, and first and second pass transistors 303 and 306)). However, the present inventive concept is not limited thereto.

Figure 4:
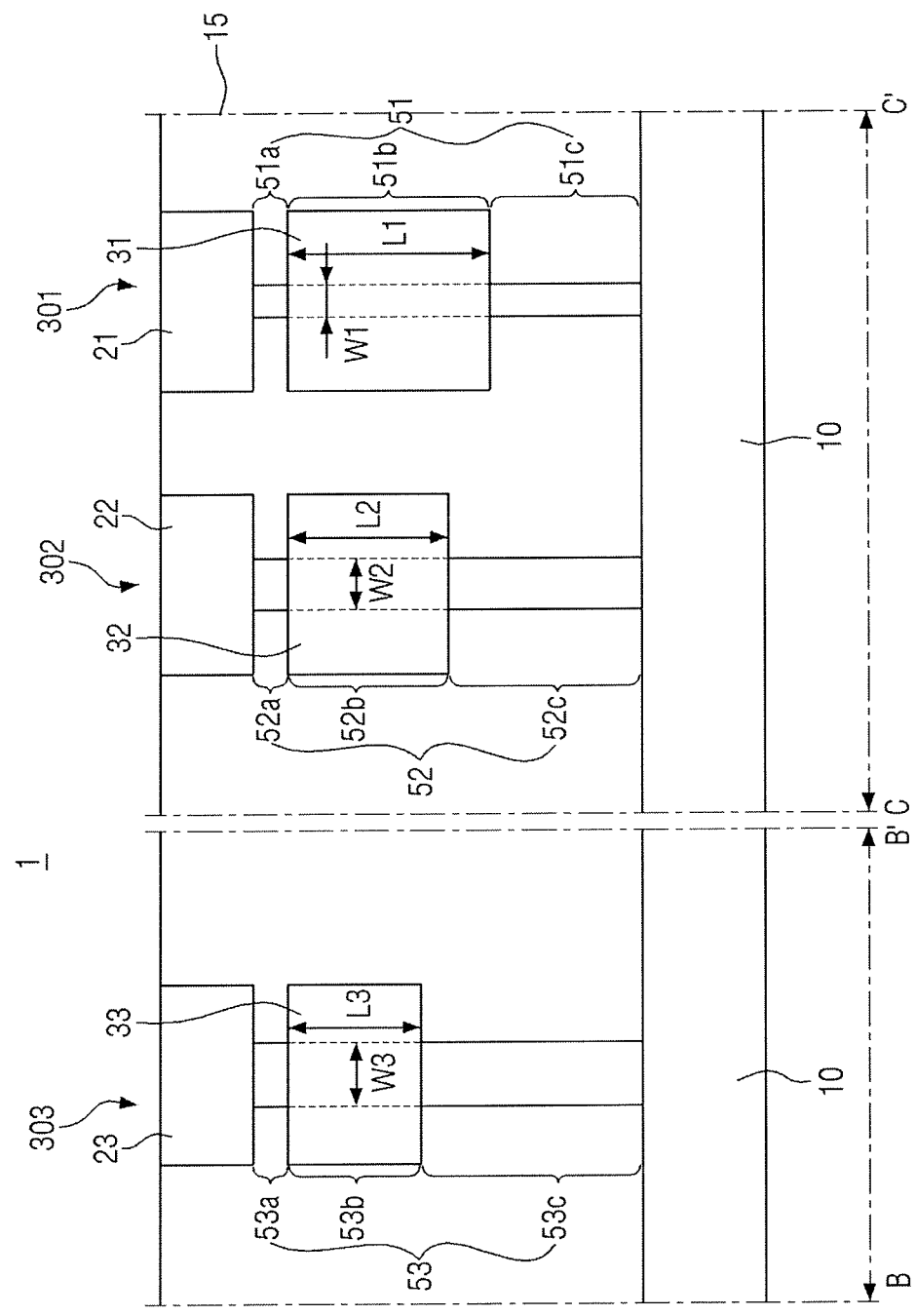
FIG. 4 is a cross-sectional view taken along lines B-B' and C-C' of FIG. 1.

FIG. 4 is a cross-sectional view taken along the lines B-B' and C-C' of FIG. 1.

Referring to FIG. 4, the part taken along the line B-B' illustrates the cross sectional view of the first pass transistor 303, and the part taken along the line C-C' illustrates the cross sectional views of the first pull-up transistor 301 and the first pull-down transistor 302.

The first pull-up transistor 301 may include a third channel pattern 51 extending in the first direction, and a third gate electrode 31 which covers a part of the third channel pattern 51. The first pull-down transistor 302 may include a fourth channel pattern 52 extending in the first direction, and a fourth gate electrode 32 which covers a part of the fourth channel pattern 52. The first pass transistor 303 may include a fifth channel pattern 53 extending in the first direction, and a fifth gate electrode 33 which covers a part of the fourth channel pattern 52.

This means that the width of the channel of the first pass transistor 303 is wider than the width of the channel of the first pull-up transistor 301. For example, the disturb margin of an SRAM write operation may depend on the gamma ratio which is a current ratio of the first pull-up transistor 301 to the first pass transistor 303. To ensure a sufficient disturb margin, the magnitude of the gamma ratio need to be 2 or higher.

For example, a width w3 of the fifth channel pattern 53 may be wider than a width w2 of the fourth channel pattern 52. For example, the width w3 may be 1.2 times the width w2. This means that the width of the channel of the first pass transistor 303 is wider than the width of the channel of the first pull-down transistor 302. For example, the disturb margin of an SRAM read operation may depend on the beta ratio which is a current ratio of the first pull-down transistor 302 to the first pass transistor 303. To ensure a sufficient margin, the magnitude of the beta need to be 1.2 or higher.

Thus, the beta ratio may be adjusted by adjusting the width w3 of the fifth channel pattern 53 and the width w2 of the fourth channel pattern 52 with other conditions set to be the same when designing the SRAM cell 300.

The beta ratio may be set to an integer ratio by changing the number of fins overlapped with a gate electrode in a FinFET structure.

In an exemplary embodiment, the beta ratio may be set to a fractional ratio by adjusting widths. For example, the width w3 of the fifth channel pattern 53 and the width w2 of the fourth channel pattern 52 may be adjusted to set the beta ratio to a fractional ratio. In this case, the beta ratio may be set to an integer ratio by adjusting widths. Similarly, the current ratio of the second pull-down transistor 305 to the second pass transistor 306 may be adjusted to secure the disturb margin of the SRAM cell 300.

Meanwhile, the width w3 of the fifth channel pattern 53 of the first pass transistor 303 may be wider than the width w1 of the third channel pattern 51 of the first pull-up transistor 301. For example, the width w3 may be around 2 or more times the width w1.

This means that the width of the channel of the first pass transistor 303 is wider than the width of the channel of the first pull-up transistor 301. For example, the disturb margin of an SRAM write operation may depend on the gamma ratio which is a current ratio of the first pull-up transistor 301 to the first pass transistor 303. To ensure a sufficient margin, the magnitude of the gamma ratio need to be 2 or higher.

Thus, the gamma ratio may be adjusted by adjusting the width w3 of the fifth channel pattern 53 and the width w1 of the third channel pattern 51 with other conditions set to be the same when designing the SRAM cell 300.

The width w3 of the fifth channel pattern 53 and the width w1 of the third channel pattern 51 may be adjusted to adjust the gamma ratio, and it is possible to set the gamma ratio to an integer ratio or a fractional ratio. Thus, SRAM yield may increase by adjusting the widths w1, w2 and/or w3.

The second part 51b of the third channel pattern 51 overlapped with the third gate electrode 31 may have a length L1. The second part 52b of the fourth channel pattern 52 overlapped with the fourth gate electrode 32 may have a length L2. The second part 53b of the fifth channel pattern 53 overlapped with the fifth gate electrode 33 may have a length L3. The lengths L1 to L3 may be different from each other.

In an exemplary embodiment, the length L2 of the second part 52b of the fourth channel pattern 52 may be greater than the length L3 of the second part 53b of the fifth channel pattern 53. For example, the length L2 may be 1.2 times or more longer than the length L3.

A length of a region in which a channel is formed may be adjusted to adjust the beta ratio of an SRAM as described above. For example, in case of applying the same voltage, when the length of the channel increases, the resistance of a channel region may increase to thus reduce the current flowing through the channel region.

Therefore, the length of the channel region may be adjusted through the adjustment of the length of the gate electrode in the first direction in each transistor, thereby adjusting the beta ratio of the SRAM cell 300.

Meanwhile, the length L1 of the third part 51b of the third channel pattern 51 may be longer than the length L3 of the second part 53b of the fifth channel pattern 53, and may preferably be 2 times or more longer than the length L3. However, the present inventive concept is not limited thereto.

Similarly, to adjust the gamma ratio of the SRAM as described above, the length of the gate electrode in the first direction may be adjusted to adjust the current ratio between the first pass transistor 303 and the first pull-up transistor 301.

Figure 5:
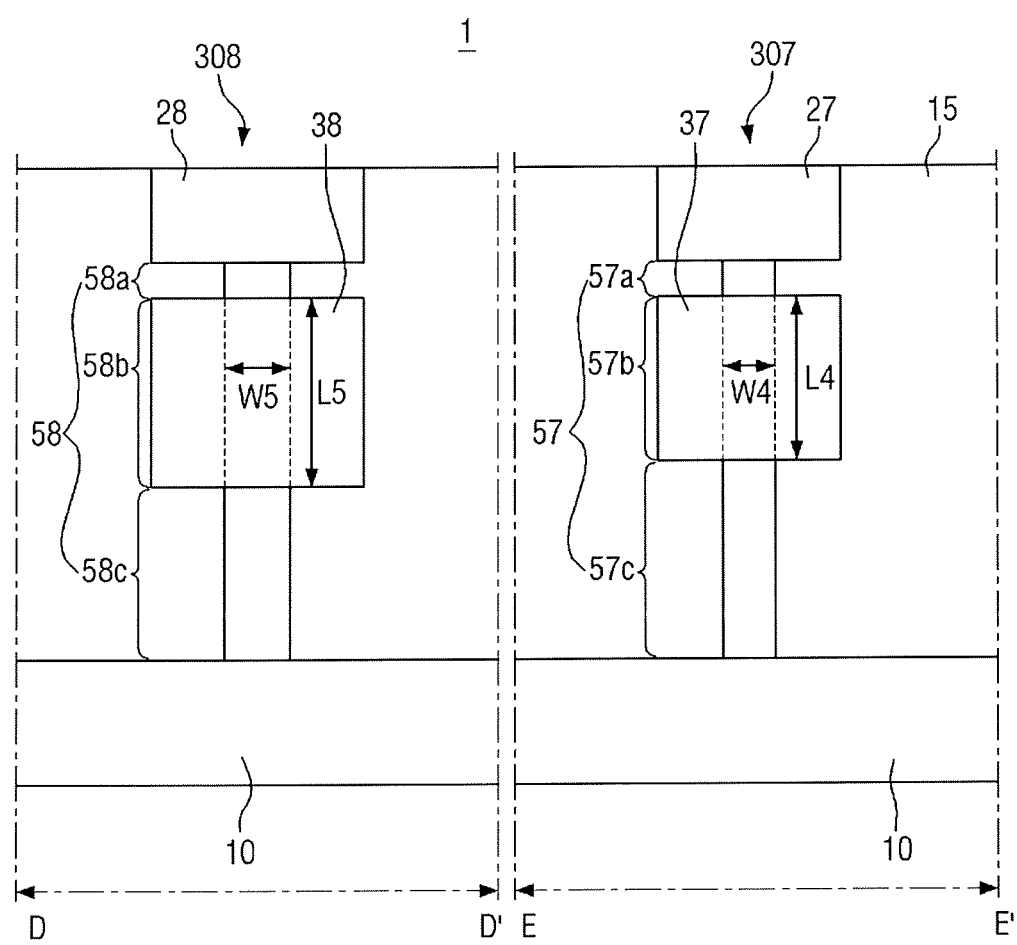
FIG. 5 is a cross-sectional view taken along lines D-D' and E-E' of FIG. 1.

FIG. 5 is a cross-sectional view taken along the lines D-D' and E-E' of FIG. 1.

Referring to FIG. 5, the part taken along the line D-D' illustrates the cross sectional view of the second read buffer transistor 308, and the part taken along the line E-E' illustrates the cross sectional surface of the first read buffer transistor 307.

The first read buffer transistor 307 may include the first channel pattern 57 extending in the first direction, and the first gate electrode 37 covering a second part 57b of the first channel pattern 57. The second read buffer transistor 308 may include the second channel pattern 58 extending in the first direction, and a second gate electrode 38 covering a second part 58b of the second channel pattern 58.

In this case, a width w4 of the first channel pattern 57 and a width w5 of the second channel pattern 58 may be different from the widths w1 to w3 of the respective third to fifth channel patterns 51 to 53.

Similarly, a length L4 of the first gate electrode 37 and a length L5 of the second gate electrode 38 (both L4 and L5 being measured in the first direction) may be different from the lengths L1 to L3 of the respective third to fifth gate electrodes 31 to 33. However, the present inventive concept is not limited thereto.

The channel length L4 and width w4 of the first read buffer transistor 307 and the channel length L5 and width w5 of the second read buffer transistor 308 may be adjusted based on the performance required to the first read buffer transistor 307 and the second read buffer transistor 308.

Figure 6:
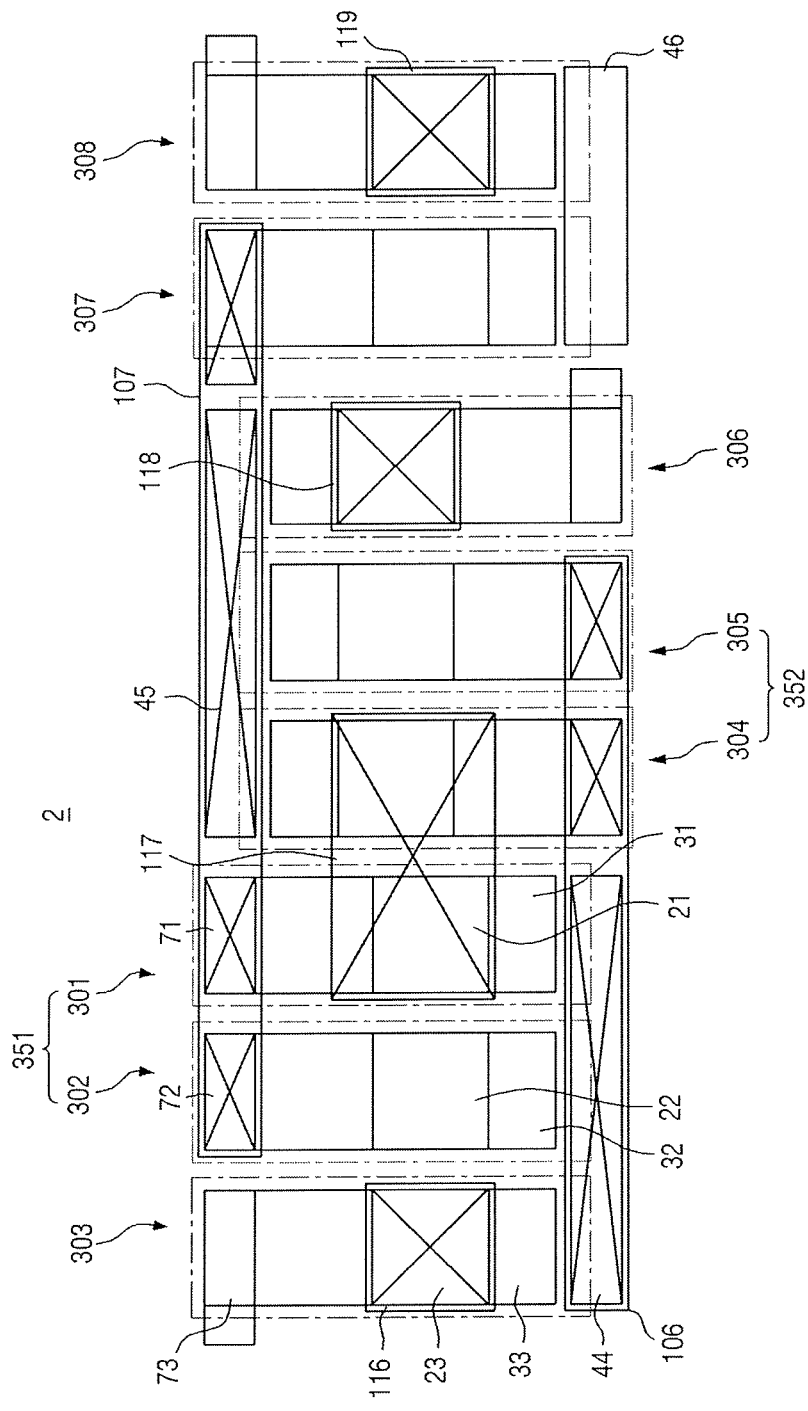
FIG. 6 is a layout diagram of a semiconductor device according to an exemplary embodiment of the present inventive concept.

FIG. 6 is a layout diagram of a semiconductor device according to an exemplary embodiment of the present inventive concept. For convenience of description, a repetitive description of the components same as those of the embodiment described above will be omitted and differences from the embodiment described above will be mainly explained.

Referring to FIG. 6, a semiconductor device 2 according to an exemplary embodiment of the present inventive concept may have a layout different from FIG. 1. However, the semiconductor device 2 may operate substantially same as the semiconductor device 1 of FIGS. 1 to 5. For example, the circuit diagram of the semiconductor device 2 may be the same as that of FIG. 2.

For example, the first pass transistor 303 and the first inverter 351 may share a first drain pattern 44. For example, the first drain pattern 44 may be shared as a common drain terminal between the first pass transistor 303 and the first inverter 351, thereby reducing the area of the semiconductor device 2. In this case, all of the first pass transistor 303, the first pull-up transistor 301 and the first pull-down transistor 302 may be disposed at one side of the first drain pattern 44. For example, all of the first pass transistor 303, the first pull-up transistor 301 and the first pull-down transistor 302 may be disposed in parallel with each other along the second direction. For the convenience of description, the first direction and the second direction are assumed to be the same in this disclosure. However, the present inventive concept is not limited thereto.

Similarly, the second pass transistor 306 and the second inverter 352 may share a second drain pattern 45. For example, the second drain pattern 45 may be shared as a common drain terminal between the second pass transistor 306 and the second inverter 352, thereby reducing the area of the semiconductor device 2. In this case, all of the second pass transistor 306, the second pull-up transistor 304 and the second pull-down transistor 305 may be disposed at one side of the second drain pattern 45. For example, all of the second pass transistor 306, the second pull-up transistor 304 and the second pull-down transistor 305 may be disposed in parallel with each other along the second direction.

The arrangement of the second drain pattern 45, the second pass transistor 306, the second pull-up transistor 304 and the second pull-down transistor 306 is different from the arrangement of the first drain pattern 44, the first pass transistor 303, the first pull-up transistor 301 and the first pull-down transistor 302. For example, the second drain pattern 45 may be positioned in a top side while the first drain pattern 44 may be positioned in a bottom side. However, the present inventive concept is not limited thereto. For example, the first drain pattern 44 may be positioned in the top side, and the second drain pattern 45 may be positioned in the bottom side. Alternatively, both of the first drain pattern 44 and the second drain pattern 45 may be positioned in the top side or the bottom side.

In this case, the first drain pattern 44 and the second drain pattern 45 may be extended in the same direction. However, the second drain pattern 45 may be disposed not to be located on the straight line region to which the first drain pattern 44 extends, but the present inventive concept is not limited thereto.

Furthermore, the first read buffer transistor 307 and the second read buffer transistor 308 may share a third drain pattern 46. For example, the first read buffer transistor 307 maybe formed to include the third drain pattern 46, and the second read buffer transistor 308 may be formed to include the third drain pattern 46 as the same drain region. The third drain pattern 46 is shared as a common drain terminal and formed neighboring the SRAM cell 300, thereby minimizing an increase in the area of the semiconductor device 2 caused due to the use of additional transistors 307 and 308. In this case, both the first read buffer transistor 307 and the second read buffer transistor 308 may be arranged at one side of the third drain pattern 46. For example, the first read buffer transistor 307 and the second read buffer transistor 308 may be disposed in parallel with each other along the second direction. Thus, the first read buffer transistor 307 and the second read buffer transistor 308 may be disposed to be directed in the same direction as those of the transistors included in the SRAM cell 300 described above. However, the present inventive concept is not limited thereto.

In this case, the third drain pattern 46 may be extended in the direction in which the first drain pattern 44 and the second drain pattern 45 are extended. The first drain pattern 44 may be disposed on the first straight line region to which the third drain pattern 46 extends, and the second drain pattern 45 may be disposed on the second straight line region parallel to and spaced apart from the first straight line region. However, the present inventive concept is not limited thereto.

The semiconductor device 2 may include a transistor structure having a vertical channel described above with reference to FIG. 3. However, the present inventive concept is not limited thereto.

Figure 7:
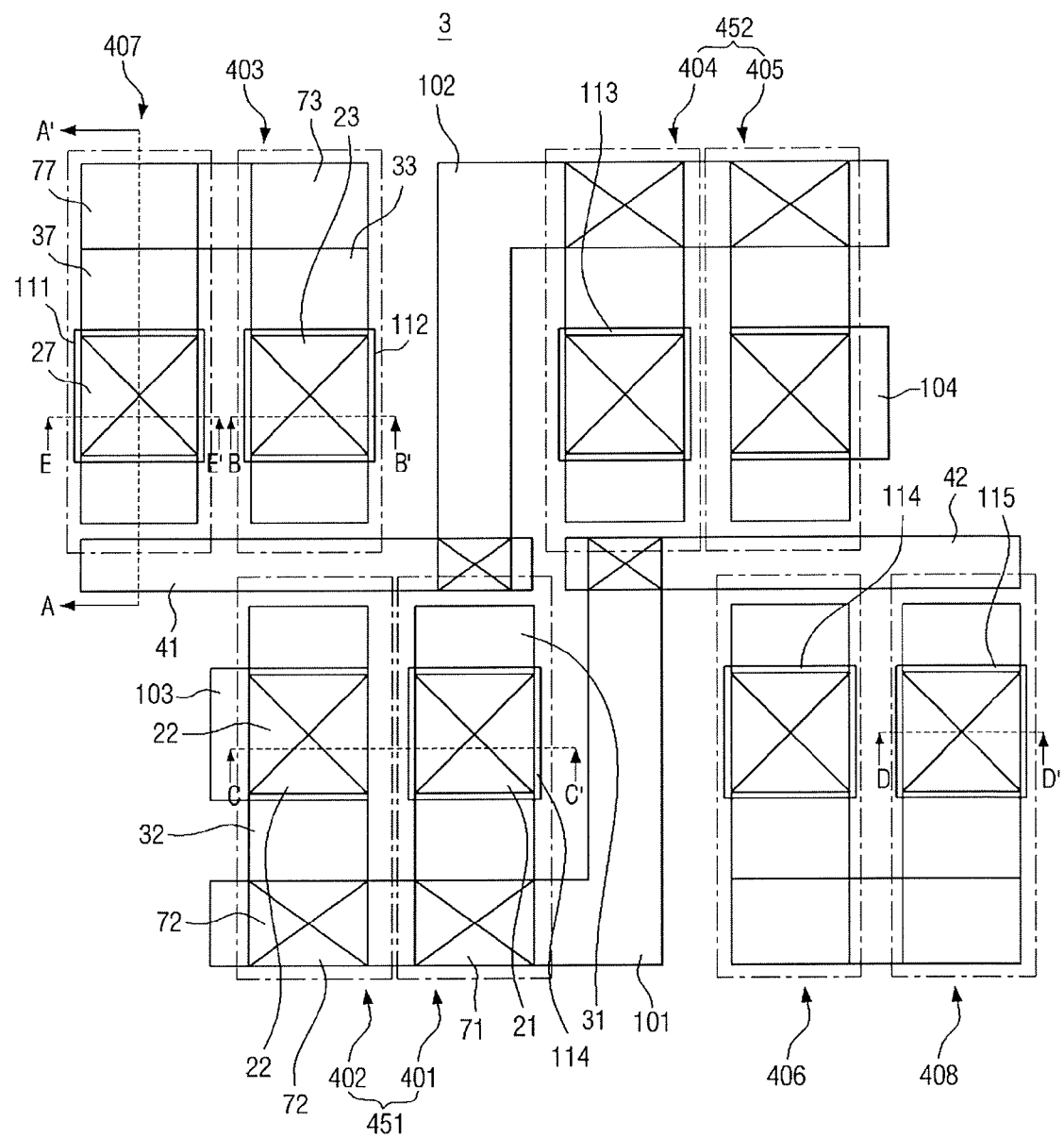
FIG. 7 is a layout diagram of a semiconductor device according to an exemplary embodiment of the present inventive concept.
Figure 8:
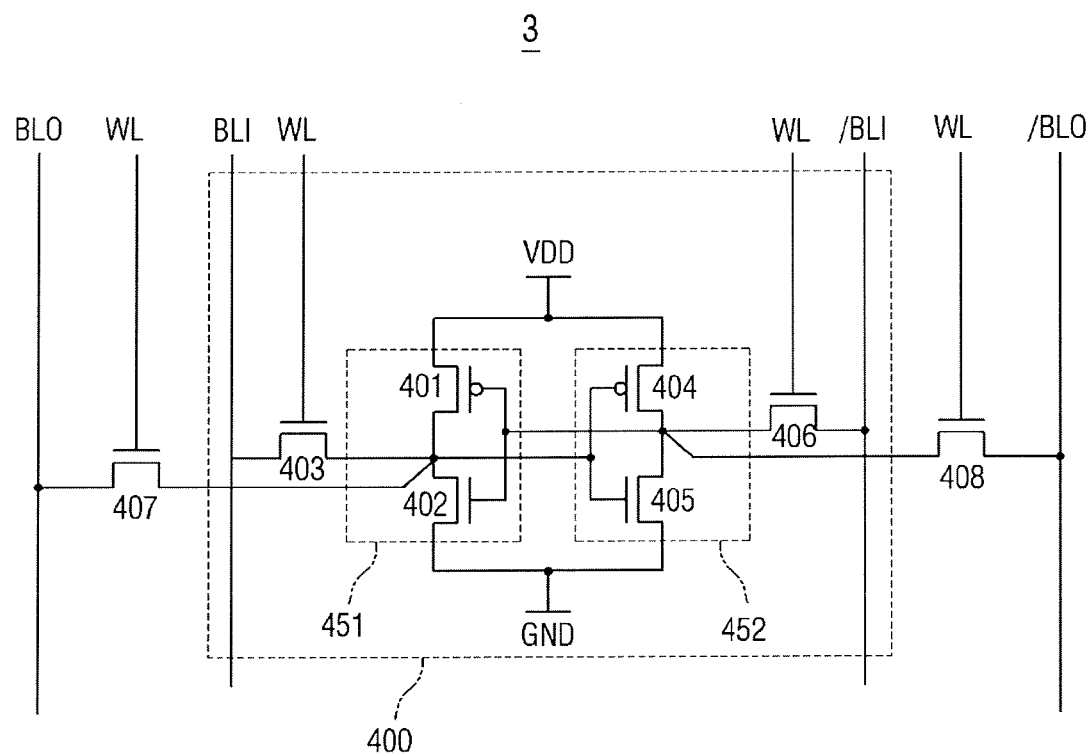
FIG. 8 is a circuit diagram of the semiconductor device of FIG. 7.

FIG. 7 is a layout diagram of a semiconductor device according to an exemplary embodiment of the present inventive concept. FIG. 8 is a circuit diagram of the semiconductor device of FIG. 7. For convenience of description, repetitive descriptions of the same components as those of the exemplary embodiment described above will be omitted and differences from the embodiments described above will be mainly explained.

Referring to FIG. 7 and FIG. 8, a semiconductor device 3 may include an SRAM cell 400. The SRAM cell 400 included in the semiconductor device 3 may be configured and operate substantially the same as the SRAM cell 300 of FIG. 2.

For example, the SRAM cell 400 may include a first inverter 451, a second inverter 452, a first pass transistor 403 and a second pass transistor 406.

However, the semiconductor device 3 of the present inventive concept may further include a third pass transistor 407 and a fourth pass transistor 408. The third pass transistor 407 and the first pass transistor 403 may share a gate terminal and a drain terminal. For example, the third pass transistor 407 and the first pass transistor 403 may share the first drain pattern 41, and the same wordline WL may be connected to each gate thereof However, the first pass transistor 403 may be connected to a first inner bitline and the third pass transistor 407 may be connected to a first outer bitline.

Similarly, the fourth pass transistor 408 and the second pass transistor 406 may share a gate terminal and a drain terminal. For example, the fourth pass transistor 408 and the second pass transistor 406 may share the second drain pattern 42, and the same wordline WL may be applied to each gate thereof. However, the second pass transistor 406 may be connected to a second inner bitline and the fourth pass transistor 408 may be connected to a second outer bitline.

In this case, the third pass transistor 407 and the fourth pass transistor 408 may include a transistor having a vertical channel structure described above with reference to FIG. 3. For example, the cross sectional view taken along the line A-A' of FIG. 7 may substantially be the same as FIG. 3. However, the present inventive concept is not limited thereto.

As the third pass transistor 407 and the fourth pass transistor 408 are added, the semiconductor device 3 of the present inventive concept may operate in a first mode and a second mode having different reading speeds. The semiconductor device 3 of the present inventive concept may operate as a dual-port SRAM.

The first pass transistor 403 and the third pass transistor 407 of the present inventive concept may form a first port, and the second pass transistor 406 and the fourth pass transistor 408 of the present inventive concept may form a second port. For example, in the first mode, only one of the first pass transistor 403 and the third pass transistor 407 may operate; in the second mode, both the first pass transistor 403 and the third pass transistor 407 may operate together. Thus, the reading speed of the second mode may be faster than the reading speed of the first mode. In this case, the first pass transistor 403 and the third pass transistor 407 may use bitlines different from each other to be independently controlled. However, the present inventive concept is not limited thereto.

Since the semiconductor device 3 of the present inventive concept may have two read modes (for example, the first mode and the second mode), it may be possible to adjust the reading speed. Furthermore, pairs of pass transistors may be disposed adjacent to each other to minimize a voltage drop due to elongated wiring, or reduction in read current.

The first pass transistor 403, the third pass transistor 407 and the first inverter 451 may share the first drain pattern 41. The first inverter 451 may be formed to include the first drain pattern 41, and the first pass transistor 403 and the third pass transistor 407 may be formed to use the first drain pattern 41 as a drain region. For example, the first pass transistor 403, the third pass transistor 407 and the first inverter 451 may share the first drain pattern 41 as a common drain terminal, thereby reducing the area of the semiconductor device 3.

The first pass transistor 403 and the third pass transistor 407 may be disposed at one side of the first drain pattern 41, and the first pull-up transistor 401 and the first pull-down transistor 402 may be disposed at the other side of the first drain pattern 41. However, the present inventive concept is not limited thereto.

For example, the first pass transistor 403 may include the first channel pattern 53 extending in the first direction vertical to the upper surface of the substrate 10, the first gate electrode 33 which covers a part of the first channel pattern 53, and the first drain pattern 41 which does not contact the first gate electrode 33, and which extends in the first direction, and which is connected to the first channel pattern 53. In this case, the first gate electrode 33 of the first pass transistor 403 may extend in the second direction intersecting the first direction, and the second pass transistor 406 and the first pull-down transistor 402 may be disposed on the straight line extending in the second direction. However, the present inventive concept is not limited thereto.

Similarly, the second pass transistor 406, the fourth pass transistor 408 and the second inverter 452 may share the second drain pattern 42. The second drain pattern 42 is shared as a common drain terminal, thereby reducing the area of the semiconductor device 3. In this case, the second pull-up transistor 404 and the second pull-down transistor 405 may be arranged at one side of the second drain pattern 42, and the second pass transistor 406 and the fourth pass transistor 408 may be arranged at the other side of the second drain pattern 42. However, the present inventive concept is not limited thereto.

In this case, the first drain pattern 41 and the second drain pattern 42 may be disposed in a straight line. For example, the second drain pattern 42 may be disposed on a straight line region to which the first drain pattern 41 extends.

The output terminal of the first inverter 451 may be connected to the second drain pattern 42 through the first node contact 101. The output terminal of the second inverter 452 may be connected to the first drain pattern 41 through the second node contact 102.

Figure 9:
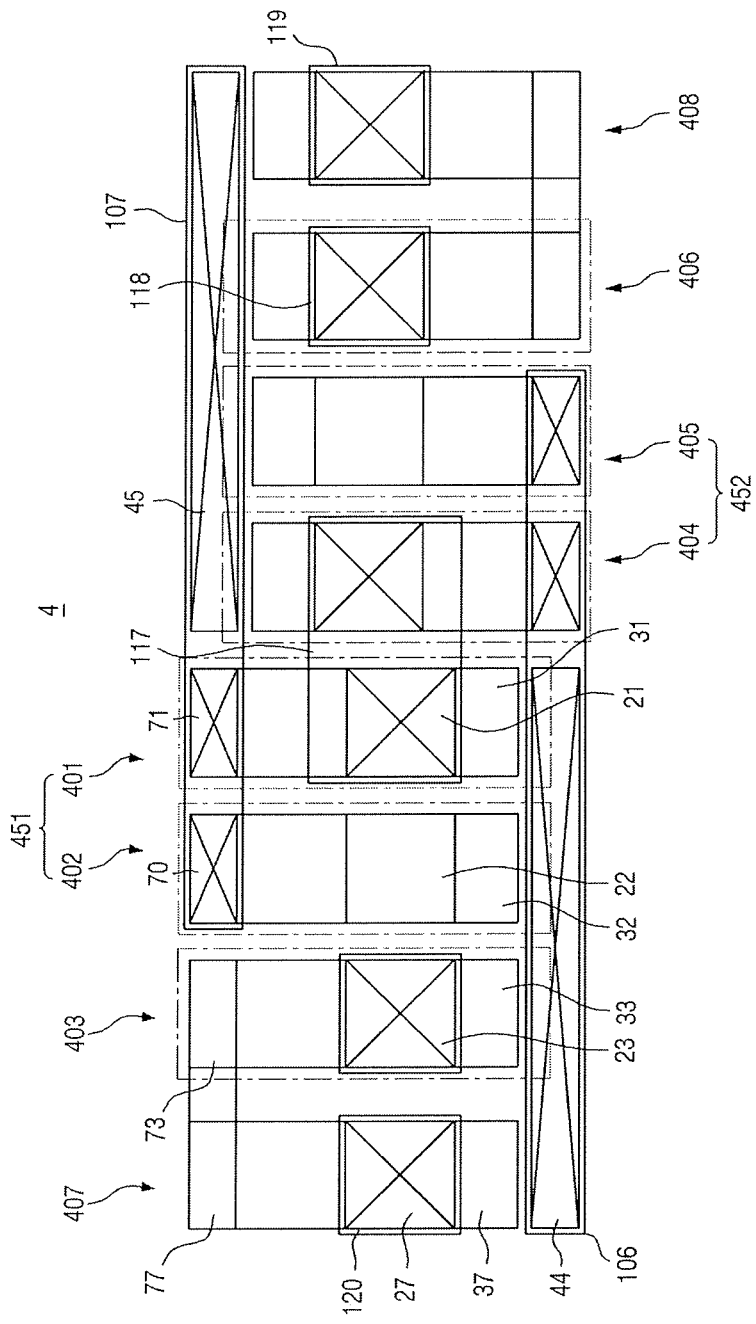
FIG. 9 is a layout diagram of a semiconductor device according to an exemplary embodiment of the present inventive concept.

FIG. 9 is a layout diagram of a semiconductor device according to an exemplary embodiment of the present inventive concept. For convenience of description, a repetitive description of the components same as those of the embodiment described above will be omitted and differences from the embodiment described above will be mainly explained.

Referring to FIG. 9, a semiconductor device 4 according to an exemplary embodiment of the present inventive concept may have a layout different from that of the semiconductor device 3 of FIG. 7. However, the semiconductor device 4 may operate substantially the same as the semiconductor device 3 of FIG. 8. For example, the circuit diagram of the semiconductor device 4 according to the fourth embodiment of the present inventive concept may be the same as FIG. 8.

For example, the first pass transistor 403, the third pass transistor 407 and the first inverter 451 may share a first drain pattern 44. For example, the first drain pattern 44 may be shared as a common drain terminal among the first pass transistor 403, the third pass transistor 407 and the first inverter 451, thereby reducing the area of the semiconductor device 4. In this case, all of the first pass transistor 403, the third pass transistor 407, the first pull-up transistor 401 and the first pull-down transistor 402 may be disposed at one side of the first drain pattern 44. For example, all of the first pass transistor 403, the third pass transistor 407, the first pull-up transistor 401 and the first pull-down transistor 402 may be disposed in parallel with each other toward the second direction. However, the present inventive concept is not limited thereto.

Similarly, the second pass transistor 406, the fourth pass transistor 408 and the second inverter 452 may share a second drain pattern 45. For example, the second drain pattern 45 may be shared as a common drain terminal among the second pass transistor 406, the fourth pass transistor 408 and the second inverter 452, thereby reducing the area of the semiconductor device 4. In this case, all of the second pass transistor 406, the fourth pass transistor 408, the second pull-up transistor 404 and the second pull-down transistor 405 may be disposed at one side of the second drain pattern 45. For example, all of the second pass transistor 406, the fourth pass transistor 408, the second pull-up transistor 404 and the second pull-down transistor 405 may be disposed in parallel with each other toward the second direction. In addition, all of the second pass transistor 406, the fourth pass transistor 408, the second pull-up transistor 404 and the second pull-down transistor 405 may be disposed in parallel with each other to be directed in the same direction as those of the first pass transistor 403, the third pass transistor 407, the first pull-up transistor 401 and the first pull-down transistor 402. However, the present inventive concept is not limited thereto.

In this case, the first drain pattern 44 and the second drain pattern 45 may be disposed to extend in the same direction. However, the second drain pattern 45 may be disposed not to be located on the straight line region to which the first drain pattern 44 extends, but the present inventive concept is not limited thereto.

Furthermore, the first pass transistor 403 and the third pass transistor 407 may be disposed neighboring with each other, and the second pass transistor 406 and the fourth pass transistor 408 may also be disposed neighboring with each other. Thus, the additional third pass transistor 407 and fourth pass transistor 408 may be formed neighboring the SRAM cell 400, thereby minimizing an increase in the area of the semiconductor device 4 caused due to the use of additional transistors. Furthermore, pairs of pass transistors may be disposed adjacent to each other, thereby minimizing voltage drop caused due to elongated wiring, or reduction in read current.

At least a part of the transistors of the semiconductor device 4 may include a transistor structure having a vertical channel described above with reference to FIG. 3 according to an exemplary embodiment. However, the present inventive concept is not limited thereto.

Figure 10:
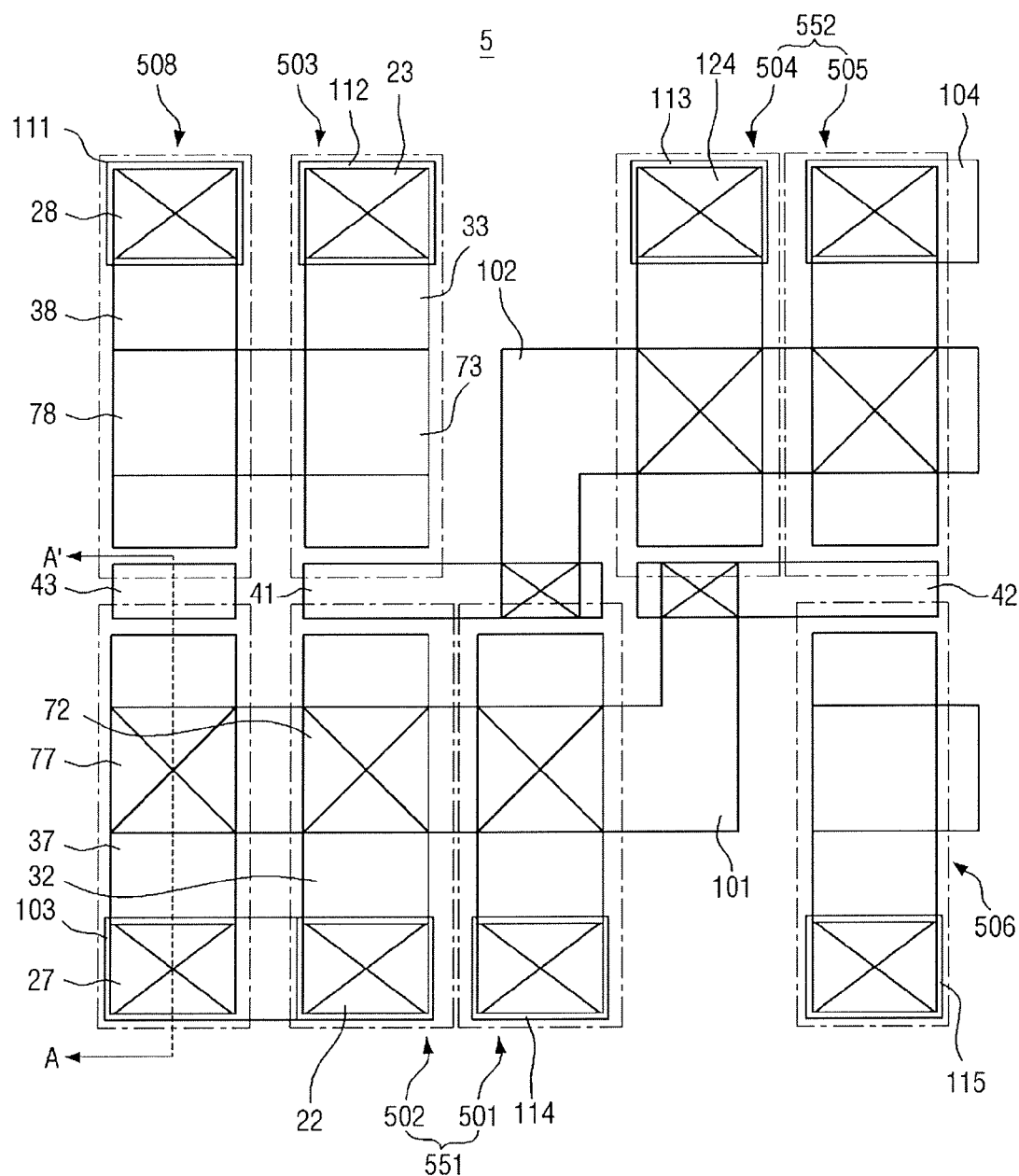
FIG. 10 is a layout diagram of a semiconductor device according to an exemplary embodiment of the present inventive concept.
Figure 11:
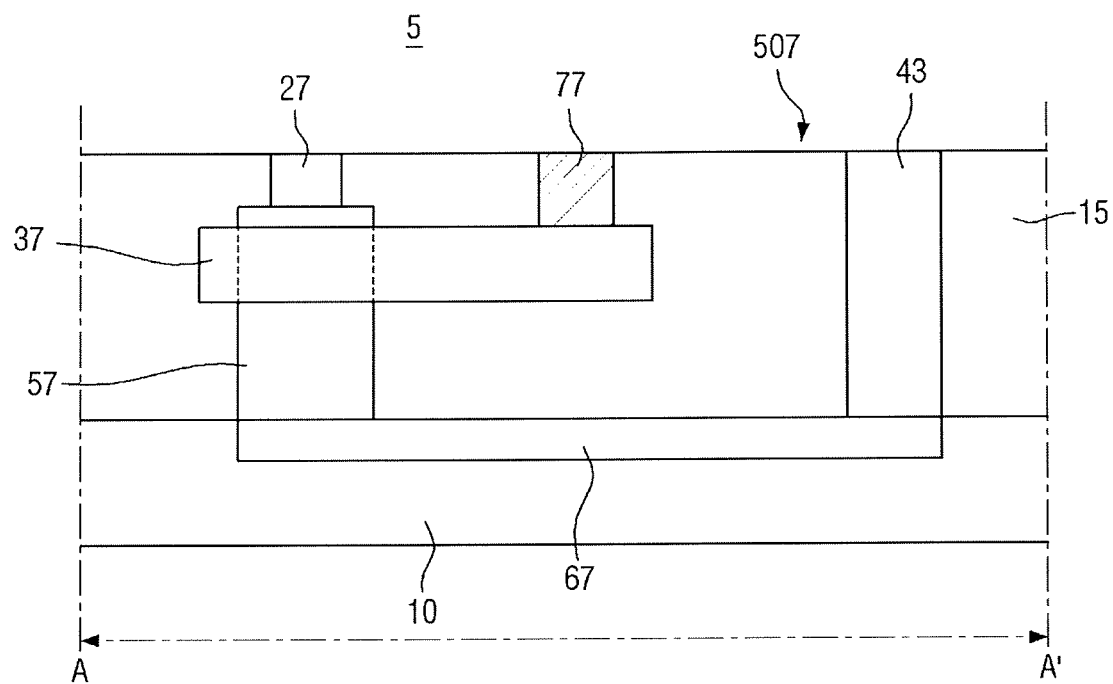
FIG. 11 is a cross-sectional view taken along line A-A' of FIG. 10.

FIG. 10 is a layout diagram of a semiconductor device according to an exemplary embodiment of the present inventive concept. FIG. 11 is a cross-sectional view taken along line A-A' of FIG. 10.

Referring to FIG. 10 and FIG. 11, a semiconductor device 5 according to an exemplary embodiment of the present inventive concept may have a layout different from that of the semiconductor device 1 of FIG. 1. However, the semiconductor device 5 may operate substantially the same as the semiconductor device 1 of FIG. 2.

For example, the semiconductor device 5 may have a gate pattern and a source pattern the positions of which may differ from those of the semiconductor device 1 of FIG. 1.

For example, the first read buffer transistor 307 of the semiconductor device 1 in FIG. 3 may include the first gate pattern 77, the first source pattern 27 and the third drain pattern 43 disposed in the same order as listed. Meanwhile, the first read buffer transistor 507 of the semiconductor device 5 may include the first source pattern 27, the first gate pattern 77 and the third drain pattern 43 disposed in the same order as listed.

The first gate electrode 37 of the first read buffer transistor 507 may extend in the direction toward the third drain pattern 43. Thus, the first gate pattern 77 formed on the first gate electrode 37 may be interposed between the first channel pattern 57 and the third drain pattern 43, and the first gate pattern 77 may be overlapped with the first conductive region 67.

The third drain pattern 43 may be formed of a material substantially the same as that of the first channel pattern 57.

FIG. 12 to FIG. 17 are diagrams illustrating intermediate process steps of a method of fabricating a semiconductor device according to an exemplary embodiment of the present inventive concept. For the convenience of description, it is assumed that the exemplary processes are applied to fabricate the semiconductor device 1 of FIG. 1.

Figure 12:
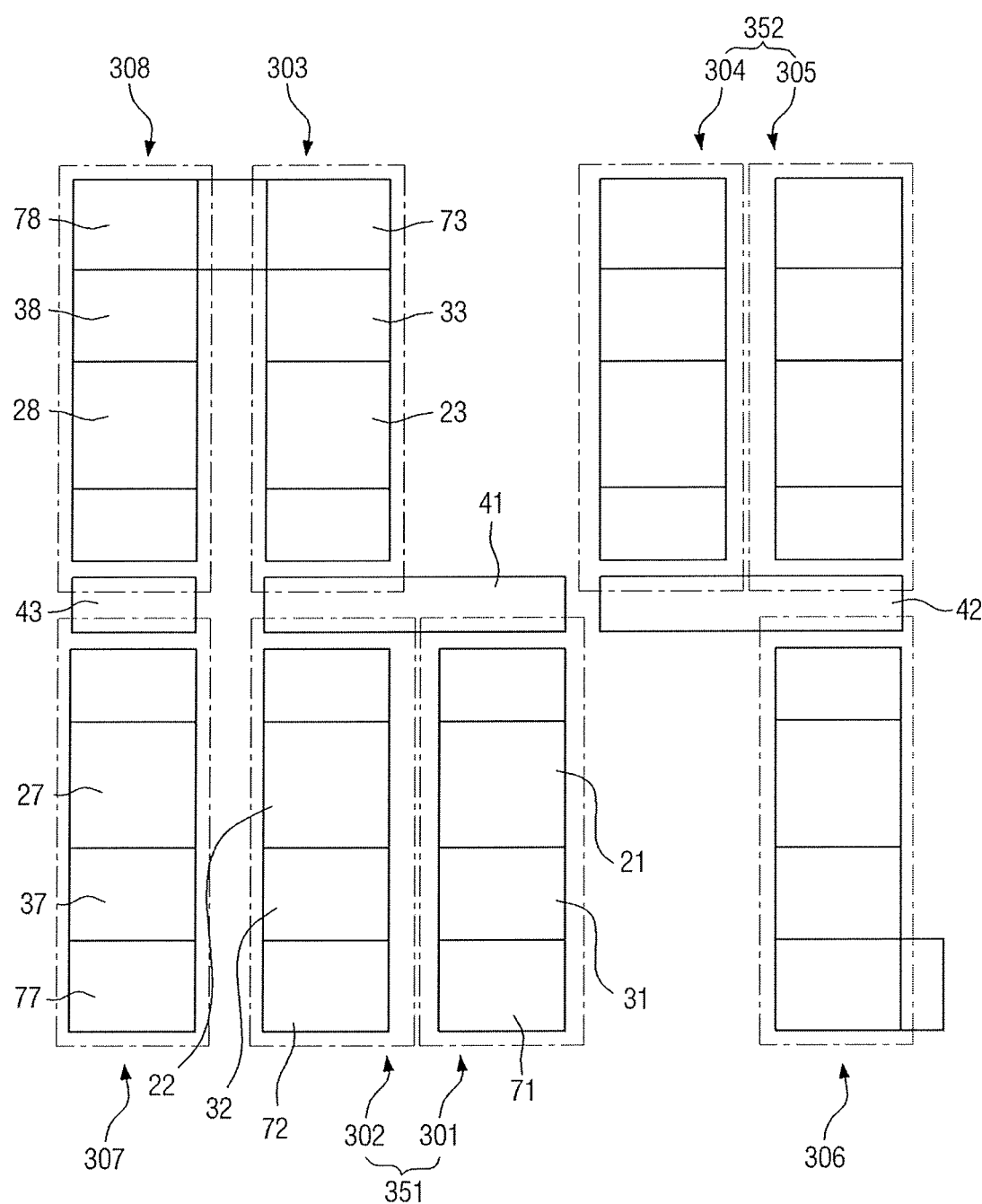
FIG. 12 to FIG. 17 are diagrams illustrating intermediate process steps of a method of fabricating the semiconductor device of FIG. 1 according to an exemplary embodiment of the present inventive concept.

Referring to FIG. 12, the first pull-down transistor 302, the first pull-up transistor 301, the first pass transistor 303, the second pull-down transistor 305, the second pull-up transistor 304, the second pass transistor 306, the first read buffer transistor 307 and the second read buffer transistor 308 may be formed on the substrate 10.

In this case, the gate pattern and the source pattern of each of the first pull-down transistor 302 and the first read buffer transistor 307 may be integrally formed. Furthermore, the gate pattern of each of the first pass transistor 303 and the second read buffer transistor 308 may be integrally formed.

Figure 13:
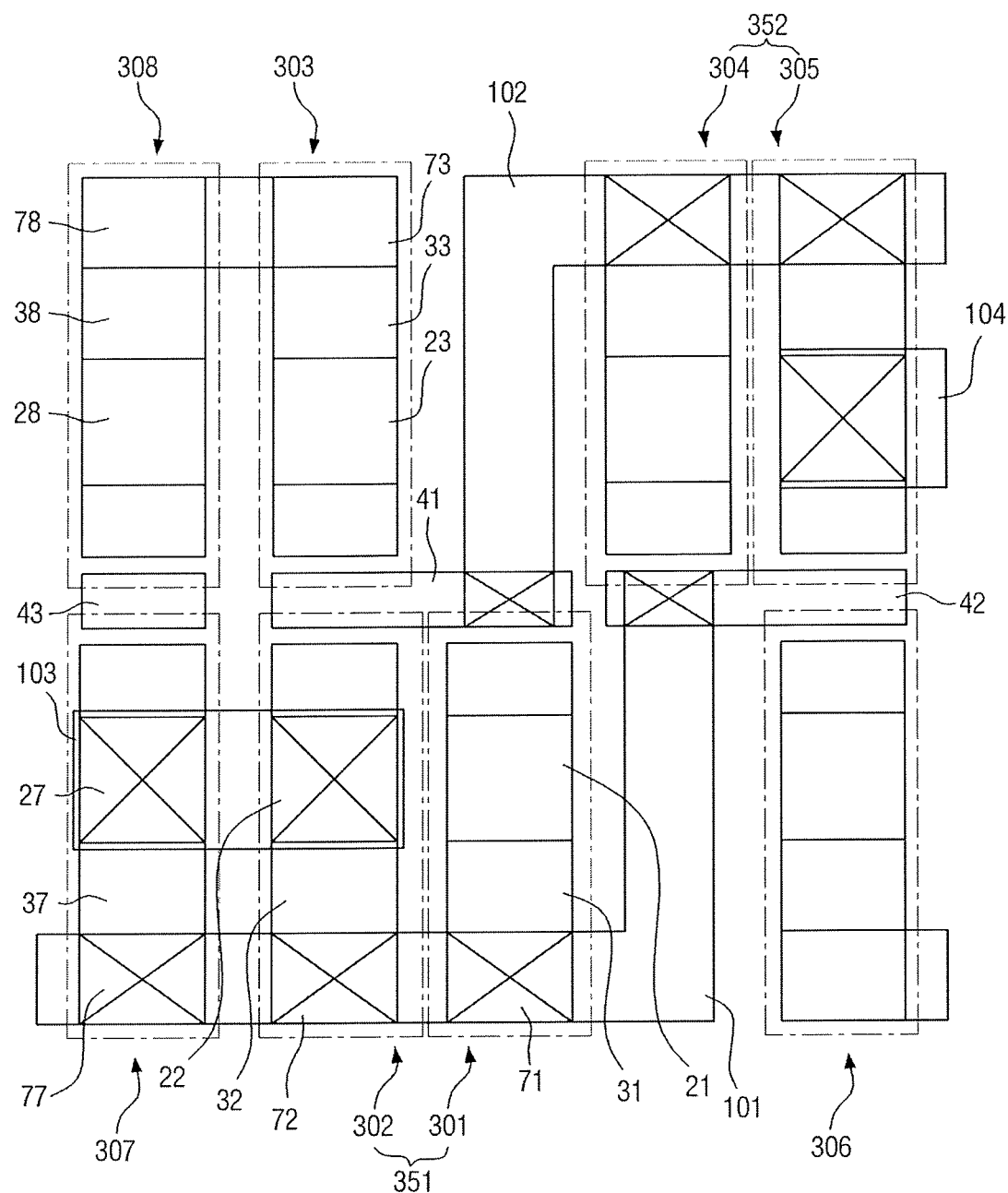

Referring to FIG. 13, first to fourth node contacts 101 to 104 may be formed. The first node contact 101 may connect the gate patterns of the first pull-up transistor 301, the first pull-down transistor 302 and the first read buffer transistor 307 to the second drain pattern 42. The second node contact 102 may connect the gate patterns of the second pull-up transistor 304 and the second pull-down transistor 305 to the first drain pattern 41. The third node contact 103 may be connected to the gate patterns of the first pull-down transistor 302 and the first read buffer transistor 307. The fourth node contact 104 may be connected to the source pattern of the second pull-down transistor 305.

Figure 14:
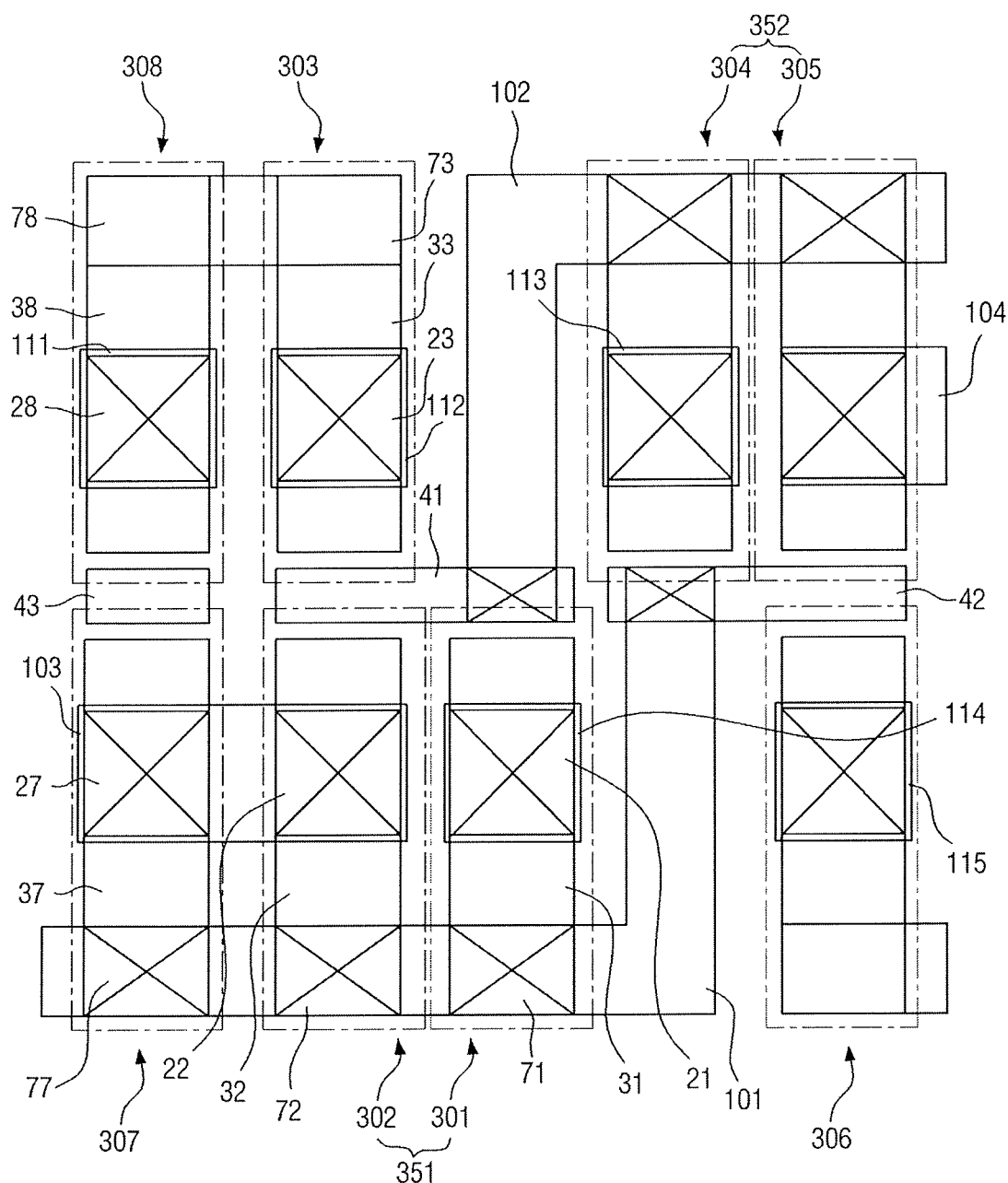

Referring to FIG. 14, first to third bitline contacts 111, 112 and 115 and first and second power contacts 113 and 114 may be formed. The first bitline contact 111 may be connected to a source contact 28 of the second read buffer transistor 308. The second bitline contact 112 may be connected to a source contact 23 of the first pass transistor 303. The third bitline contact 115 may be connected to a source contact of the second pass transistor 306.

Furthermore, the first power contact 113 may be connected to a source contact of the second pull-up transistor 304. The second power contact 114 may be connected to a source contact of the first pull-up transistor 301.

Figure 15:
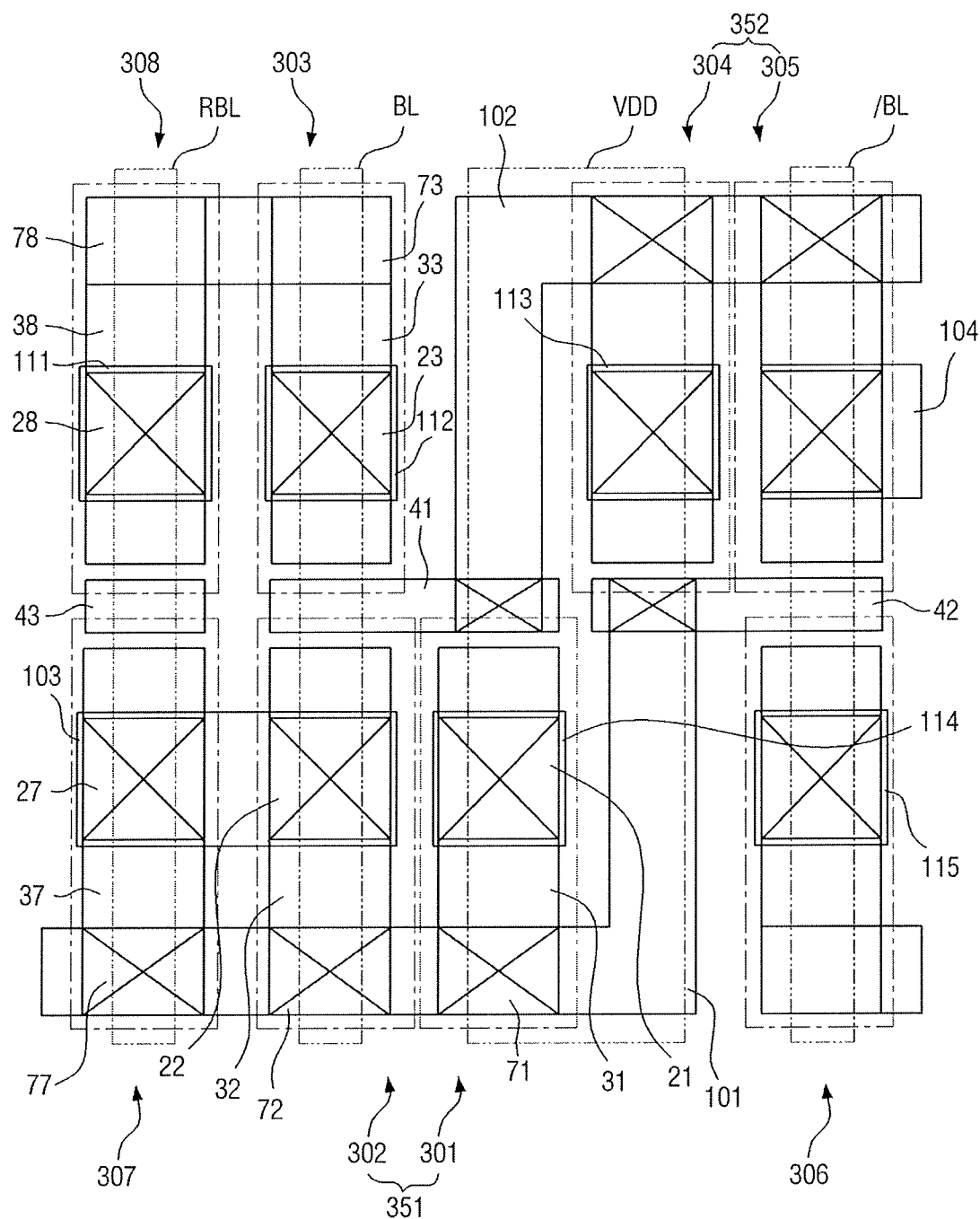

Referring to FIG. 15, the read bitline RBL, the bit line BL, the power line VDD and the complementary bitline /BL may be formed. The read bitline RBL may be connected to the first bitline contact 111. The bitline BL may be connected to the second bitline contact 112. The power line VDD may be connected to the first power contact 113 and the second power contact 114. The complementary bitline /BL may be connected to the third bitline contact 115. The read bitline RBL, the bit line BL, the power line VDD and the complementary bitline /BL may be formed to extend in the second direction. However, the present inventive concept is not limited thereto.

Figure 16:
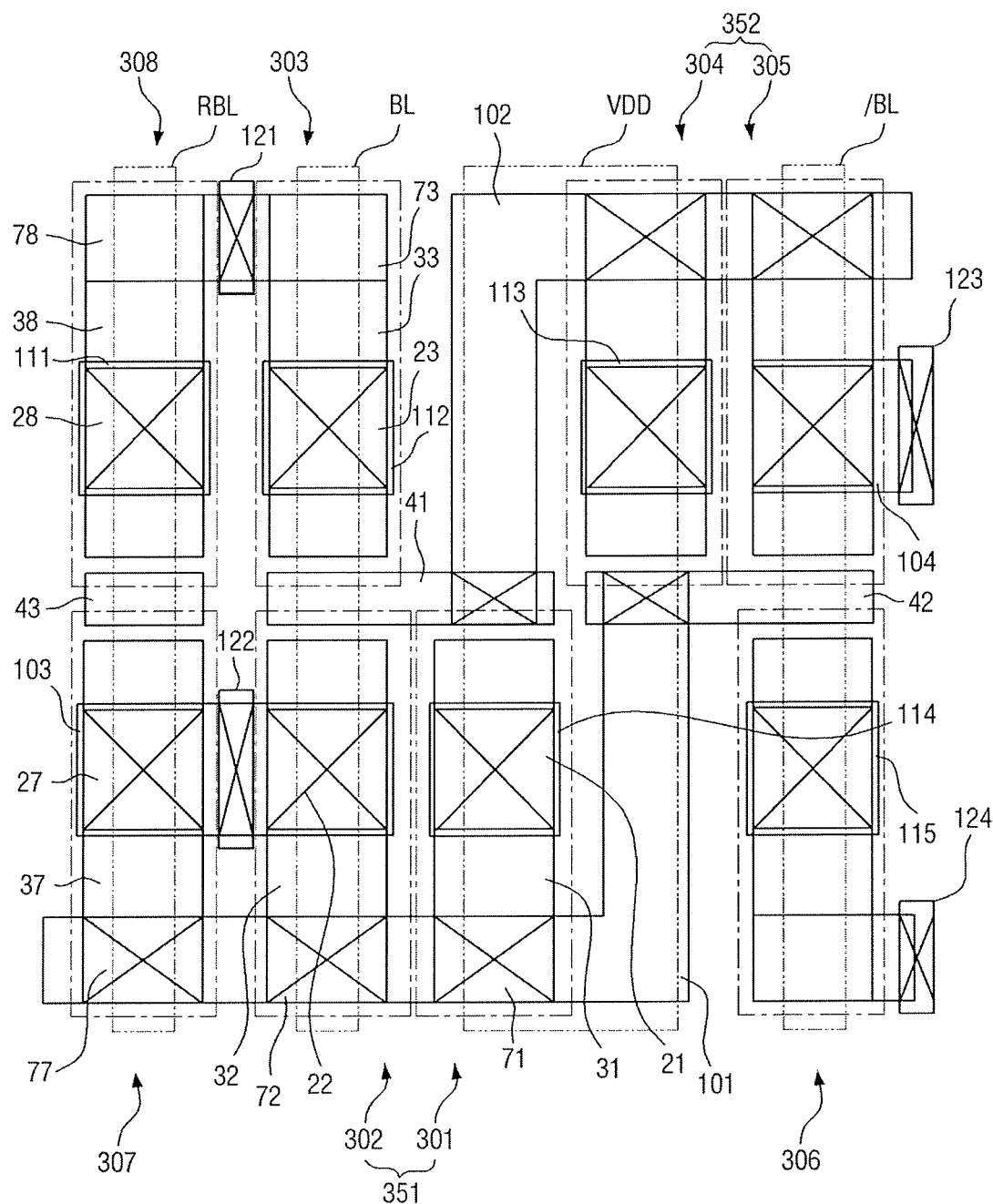

Referring to FIG. 16, first to fourth via contacts 121 to 124 may be formed. The first via contact 121 may be connected to the gate patterns of the first pass transistor 303 and the first read buffer transistor 307. The second via contact 122 may be connected to the third node contact 103. The third via contact 123 may be connected to the fourth node contact 104. The fourth via contact 124 may be connected to the gate pattern of the second pass transistor 306.

Figure 17:
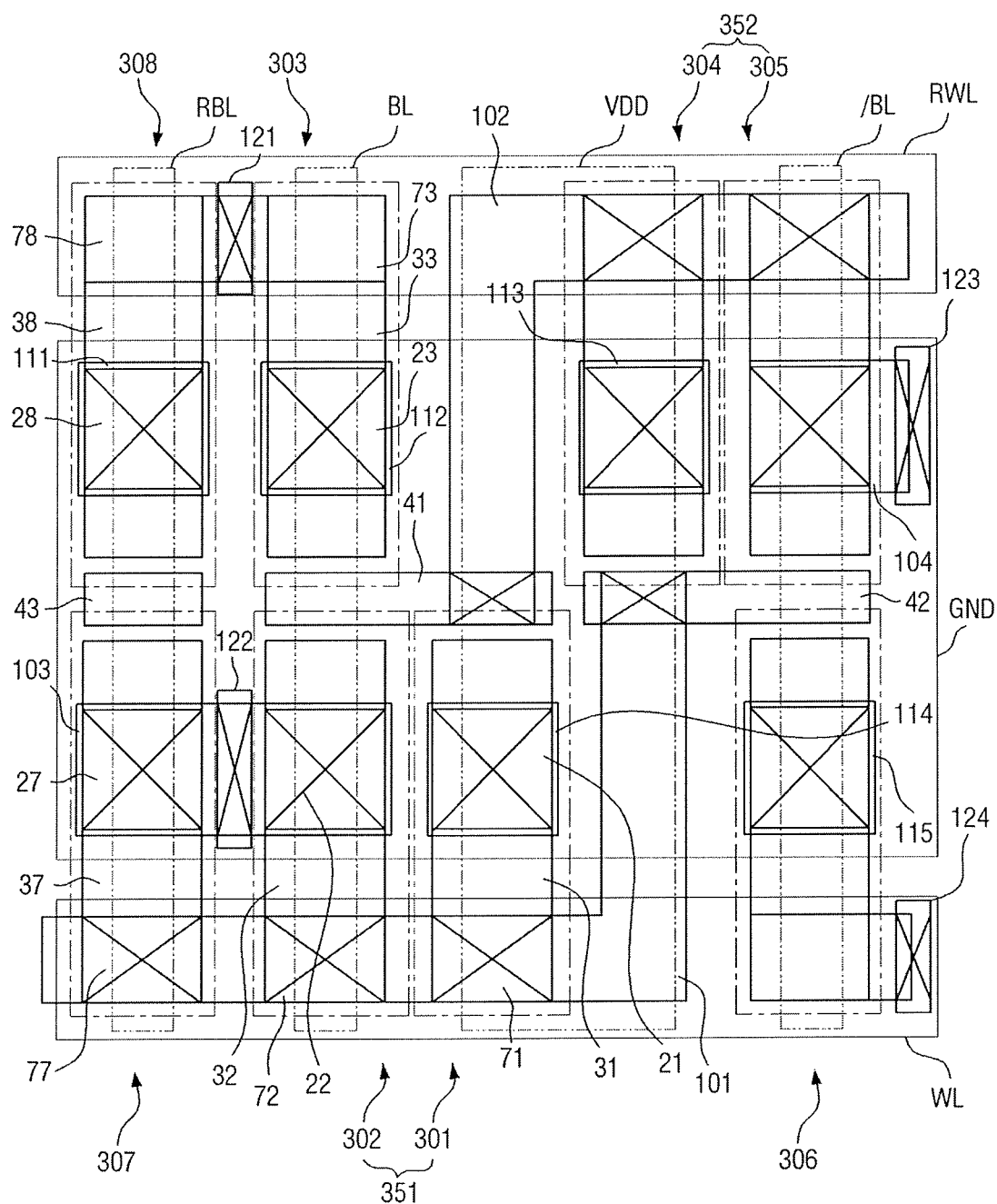

Referring to FIG. 17, the first wordline RWL, the second wordline WL and the ground line GND may be formed. The first wordline RWL may be connected to the first via contact 121. The ground line GND may be connected to the second via contact 122 and the third via contact 123. The wordline WL may be connected to the fourth via contact 124.

The first wordline RWL may be activated in a read mode, and the second wordline WL may be activated in a write mode. However, the present inventive concept is not limited thereto.

Figure 18:
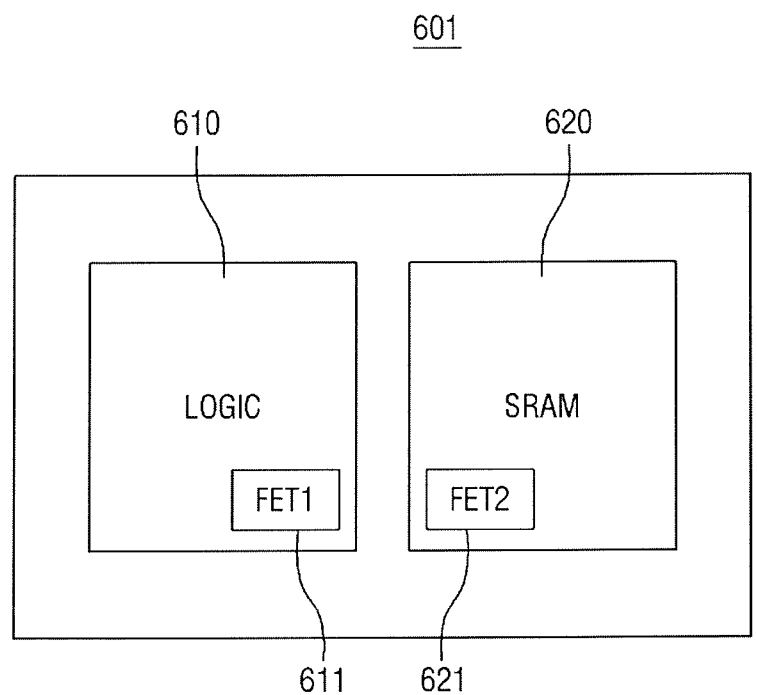
FIG. 18 is a diagram illustrating a semiconductor device according to an exemplary embodiment of the present inventive concept.
Figure 19:
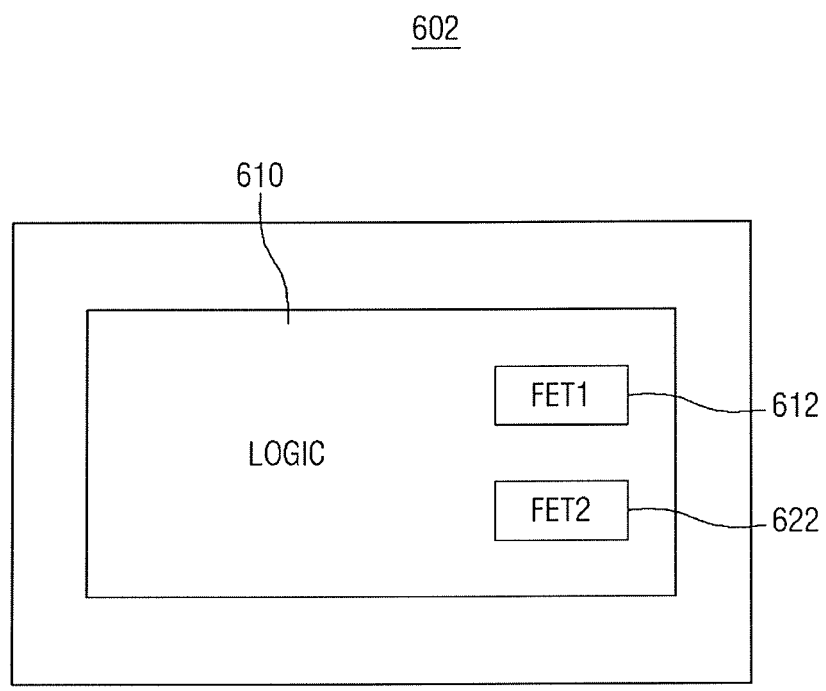
FIG. 19 is a diagram illustrating a semiconductor device according to an exemplary embodiment of the present inventive concept.

FIGS. 18 and 19 show semiconductor devices according to exemplary embodiments of the present inventive concept. Hereinafter, differences from the exemplary embodiments described above will be mainly described.

Referring first to FIG. 18, a semiconductor device 601 according to an exemplary embodiment of the present inventive concept may include a logic area 610 and an SRAM region 620. A first transistor 611 may be disposed in the logic area 610, and a second transistor 621 may be disposed in the SRAM region 620. The present inventive concept is not limited thereto. For example, the present inventive concept may be applied to a semiconductor device including the logic area 610 and an area to which other memories (for example, DRAM, MRAM, RRAM, PRAM and the like) are applied.

Referring now to FIG. 19, a semiconductor device 602 according to an exemplary embodiment of the present inventive concept may include the logic region 610 having third and fourth transistors 612 and 622 different from each other. Meanwhile, although not shown separately, third and fourth transistors 612 and 622 different from each other may be disposed in the SRAM region.

Referring back to FIG. 18, the first transistor 611 may be a semiconductor device according to an exemplary embodiment of the present inventive concept, and the second transistor 621 may be a semiconductor device according to an exemplary embodiment of the present inventive concept. For example, the first transistor 611 may be the semiconductor device 1 of FIG. 1, and the second transistor 621 may be the semiconductor device 2 of FIG. 6.

Referring back to FIG. 19, the third transistor 412 may be a semiconductor device according to an exemplary embodiment of the present inventive concept, and the fourth transistor 422 may be a semiconductor device according to an exemplary embodiment of the present inventive concept.

Figure 20:
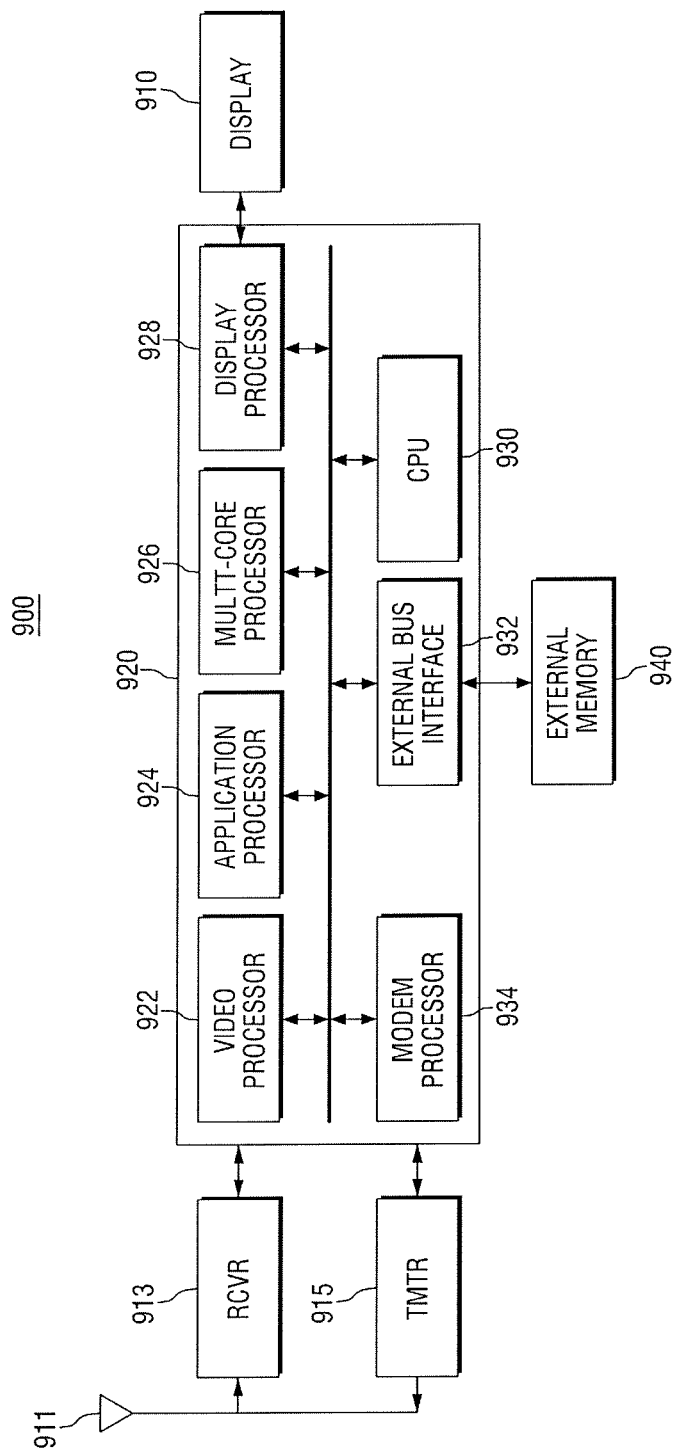
FIG. 20 is a block diagram illustrating a wireless communication device including a semiconductor device according to an exemplary embodiments of the present inventive concept.

FIG. 20 shows a wireless communication device including a semiconductor device according to an exemplary embodiment of the present inventive concept.

Referring to FIG. 20, a device 900 may be a cellular phone, a smartphone terminal, a handset, a personal digital assistant (PDA), a laptop computer, a video game unit or other devices. The device 900 may use code division multiple access (CDMA), time division multiple access (TDMA) such as the global system for mobile (GSM) telecommunications, or other wireless communication standards.

The device 900 may provide two-way communication through a receiving path and a transmitting path. Signals transmitted by one or more base stations may be received by an antenna 911 or provided to a receiver (RCVR) 913 on the receiving path. The receiver 913 may condition and digitalize the received signal, and may provide samples to a digital section 920 for additional processing. A transmitter (TMTR) 915 may receive data transmitted from the digital section 920, process and condition the data, generate a modulated signal, and transmit the modulated signal to one or more base stations through the antenna 911 on the transmitting path.

The digital section 920 may be implemented as one or more digital signal processors (DSPs), microprocessors, reduced instruction set computers (RISCs) and the like. Furthermore, the digital section 920 may be fabricated on one or more application specific integrated circuits (ASICs) or integrated circuits (ICs) of other types.

The digital section 920 may include various processing and interface units such as a modem processor 934, a video processor 922, an application processor 924, a display processor 928, a controller/multicore processor 926, a central processing unit 930 and an external bus interface (EBI) 932.

The video processor 922 may perform processing for graphic applications. In general, the video processor 922 may include a certain number of processing units or modules for a certain number of sets of graphic operations. A specific part of the video processor 922 may be implemented as firmware and/or software. For example, the control unit may be implemented as firmware and/or software modules (for example, procedure, function and the like) which perform the functions described above. Firmware and/or software codes may be stored in a memory and executed by a processor (for example, the multicore processor 926). The memory may be implemented within the processor or outside the processor.

The video processor 922 may implement a software interface such as an open graphics library (OpenGL) and Direct3D. The central processing unit 930 may cooperate with the video processor 922 to perform a series of graphic processing operations. The controller/multicore processor 926 may include at least two cores and allocate workloads to two cores based on the workloads to be processed by the controller/multicore processor 926 so as to simultaneously process relevant workloads.

Although the application processor 924 is depicted as a single component included in the digital section 920 in the drawing, the present inventive concept is not limited thereto. In some embodiments of the present inventive concept, the digital section 920 may be implemented as being integrated into a single application processor 924 or an application chip.

The modem processor 934 may perform an arithmetic operation required in a data transfer process between the receiver 913 and the transmitter 915 and the digital section 920. The display processor 928 may perform an arithmetic operation required for driving a display 910.

A semiconductor device according to an exemplary embodiment of the present inventive concept may be used as a cache memory, a buffer memory or the like used in arithmetic operations of the processors 922, 924, 926, 928, 930 and 934 shown in the drawing.

A computing system including the semiconductor devices according to the embodiments of the present inventive concept will now be explained with reference to FIG. 21.

Figure 21:
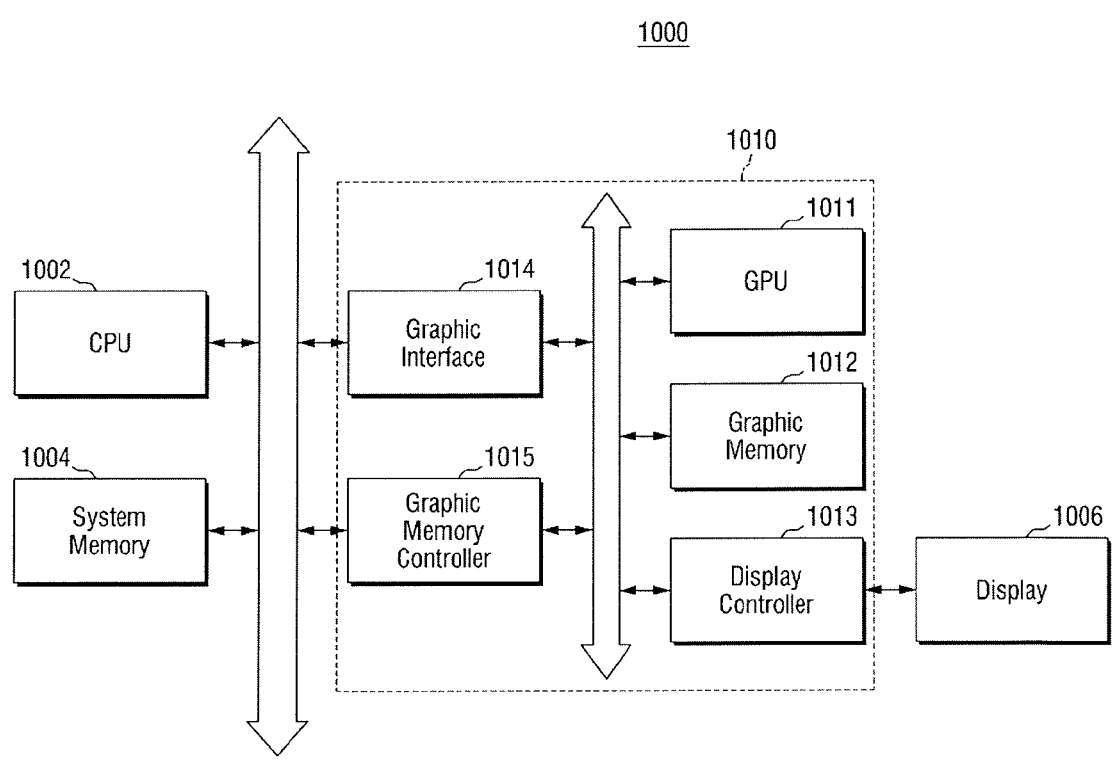
FIG. 21 is a block diagram illustrating a computing system including a semiconductor device according to an exemplary embodiments of the present inventive concept.

FIG. 21 shows a block diagram of a computing system including a semiconductor device according to an exemplary embodiment of the present inventive concept.

Referring to FIG. 21, a computing system 1000 according to one embodiment of the present inventive concept may include a central processing unit (CPU) 1002, a system memory 1004, a graphic system 1010 and a display device 1006.

The central processing unit 1002 may perform an arithmetic operation required for driving the computing system 1000. The system memory 1004 may be configured to store data therein. The system memory 1004 may store therein data processed by the central processing unit 1002. The system memory 1004 may serve as an operation memory of the central processing unit 1002. The system memory 1004 may include one or more volatile memory devices such as a double data rate synchronous DRAM (DDR SDRAM) and (a single data rate SDRAM (SDR SDRAM) and/or one or more nonvolatile memory devices such as an electrical erasable programmable ROM (EEPROM) and a flash memory. A semiconductor device according to an exemplary embodiment of the present inventive concept may be used as a component of the system memory 1004.

The graphic system 1010 may include a graphic processing unit (GPU) 1011, a graphic memory 1012, a display controller 1013, a graphic interface 1014 and a graphic memory controller 1015.

The graphic processing unit 1011 may perform graphic operation processing required in the computing system 1000. For example, the graphic processing unit 1011 may assemble a primitive constituted by at least one vertex, and perform rendering using the assembled primitives.

The graphic memory 1012 may store therein graphic data processed by the graphic processing unit 1011, or store therein graphic data provided to the graphic processing unit 1011. Alternatively, the graphic memory 1012 may serve as an operation memory of the graphic processing unit 1011. Any one of the above-described semiconductor devices 1 to 5 according to the embodiments of the present inventive concept may be used as a component of the graphic memory 1012.

The display controller 1013 may control the display device 1006 so that a rendered image frame can be displayed.

The graphic interface 1014 may interface between the central processing unit 1002 and the graphic processing unit 1011, and the graphic memory controller 1015 may provide memory access between the system memory 1004 and the graphic processing unit 1011.

Although not clearly shown in FIG. 21, the computing system 1000 may further include one or more input devices such as a button, a touch screen and a microphone, and/or one or more output devices such as a speaker. Furthermore, the computing system 1000 may further include an interface device for exchanging data with an external device in a wired or wireless manner. The interface device may include, for example, an antenna, a wired/wireless transceiver and the like.

According to the embodiment, the computing system 1000 may be a certain computing system such as a mobile phone, a smart phone, a personal digital assistant (PDA), a desktop, a notebook and a tablet.

An electronic system including the semiconductor devices according to the embodiments of the present inventive concept will now be described with reference to FIG. 22.

Figure 22:
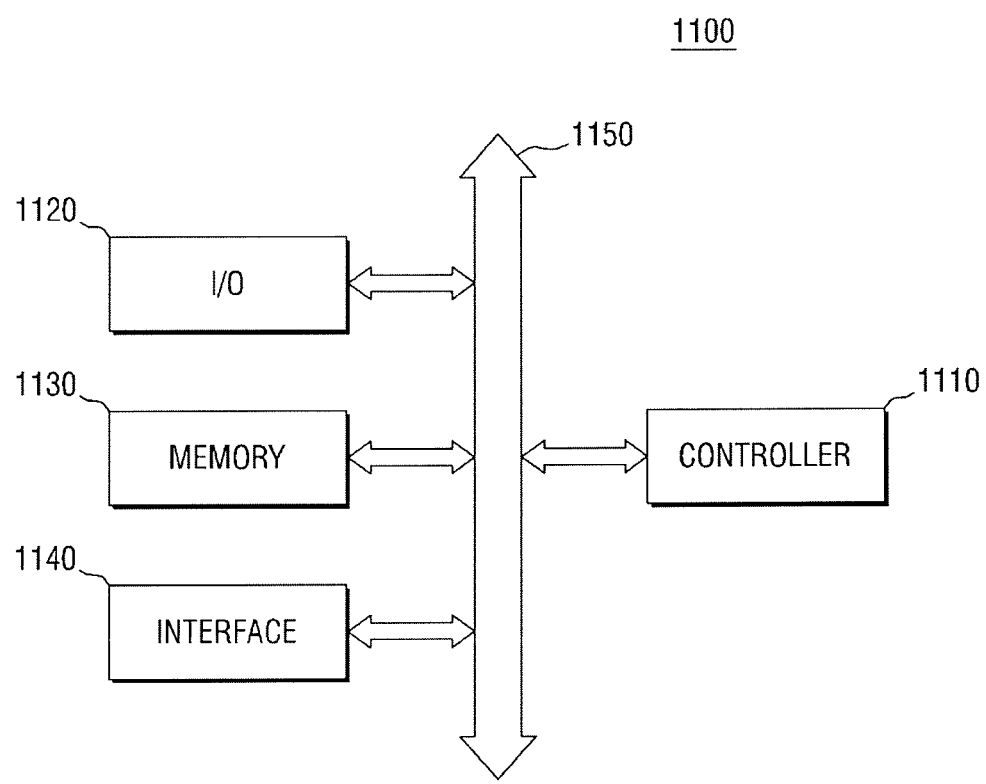
FIG. 22 is a block diagram illustrating an electronic system including a semiconductor device according to an exemplary embodiment of the present inventive concept.

FIG. 22 shows a block diagram of an electronic system including a semiconductor device according to an exemplary embodiment of the present inventive concept.

Referring to FIG. 22, an electronic system 1100 according to an exemplary embodiment of the present inventive concept may include a controller 1110, an input/output (I/O) device 1120, a memory device 1130, an interface 1140 and a bus 1150. The controller 1110, the input/output (I/O) device 1120, the memory device 1130 and/or the interface 1140 may communicate to each other through the bus 1150. The bus 1150 may serve as a path for data movement.

The controller 1110 may include at least one of a microprocessor, a digital signal processor, a microcontroller, and logic elements capable of performing functions similar to those of the microprocessor, the digital signal processor, and the microcontroller. The input/output device 1120 may include a keypad, a keyboard, a display device and the like. The memory device 1130 may store therein data and/or instructions and the like. The interface 1140 may perform the function of transmitting data to a communication network or receiving data from the communication network. The interface 1140 may be of a wired or wireless type. For example, the interface 1140 may include an antenna, a wired/wireless transceiver or the like.

Although not shown, the electronic system 1100 may further include high speed DRAM and/or SRAM as an operation memory for an operation of the controller 1110. A semiconductor device according to an exemplary embodiment of the present inventive concept may be employed as the operation memory. Furthermore, a semiconductor device according to an exemplary embodiment of the present inventive concept may be provided in the memory device 1130, or provided as a part of the controller 1110, the input/output device 1120 and the like.

The electronic system 1100 may be applied to a personal digital assistant (PDA), a portable computer, a web tablet, a wireless phone, a mobile phone, a digital music player, a memory card, or all electronic products that can transmit and/or receive information in a wireless environment.

Figure 23:
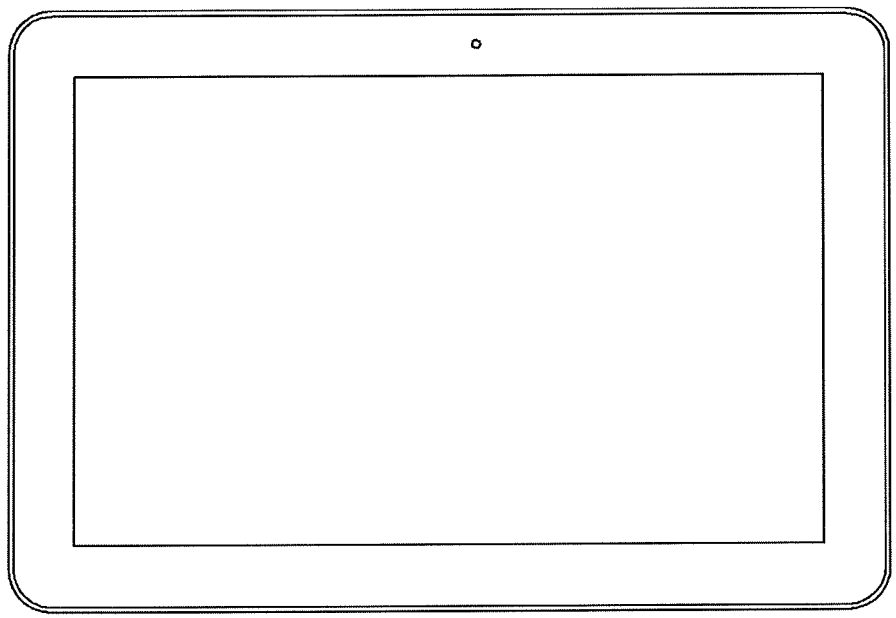
FIG. 23 to FIG. 25 are diagrams illustrating semiconductor systems including a semiconductor device according to an exemplary embodiment of the present inventive concept.
Figure 24:
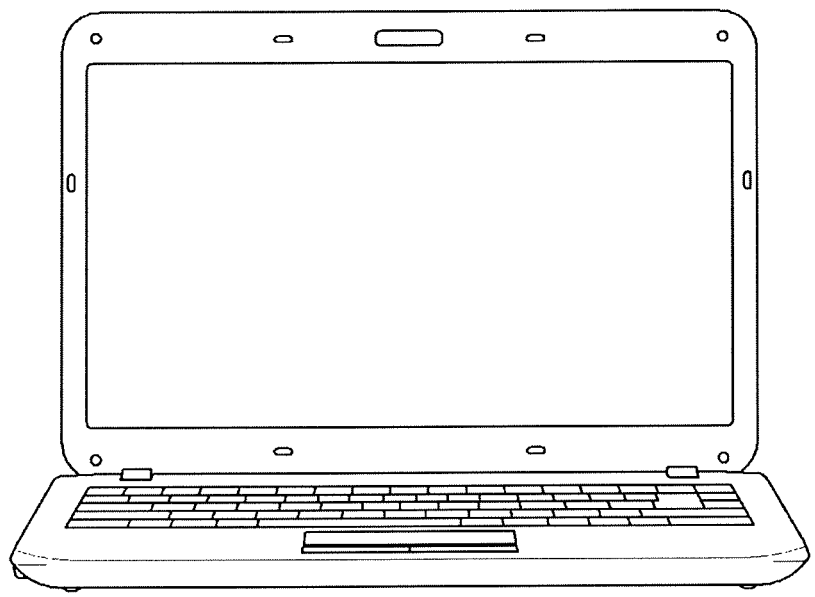
Figure 25:
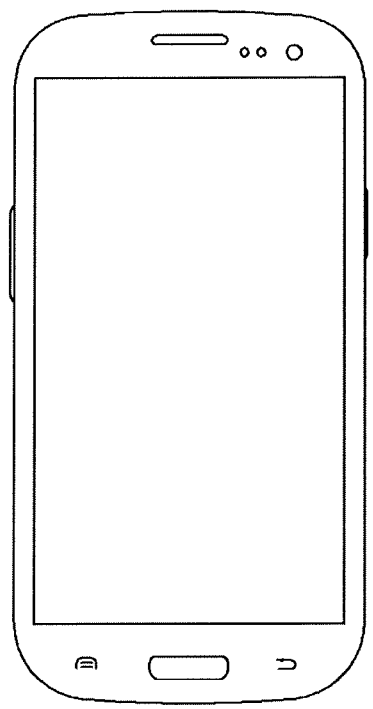

FIG. 23 to FIG. 25 show semiconductor systems including a semiconductor device according to an exemplary embodiment of the present inventive concept can be applied.

FIG. 23 illustrates a tablet PC 1200, FIG. 24 illustrates a notebook 1300, and FIG. 25 illustrates a smart phone 1400. A semiconductor device according to an exemplary embodiment of the present inventive concept may be used in the tablet PC 1200, the notebook 1300, the smart phone 1400 and the like.

A semiconductor device according to an exemplary embodiment of the present inventive concept may be applied to other electronic devices which are not illustrated herein. For example, the other electronic devices may include a computer, an ultra mobile PC (UMPC), a workstation, a net book, a personal digital assistant (PDA), a portable computer, a wireless phone, a mobile phone, an e-book, a portable multimedia player (PMP), a portable gaming console, a navigation device, a black box, a digital camera, a 3-dimensional television, a digital audio recorder, a digital audio player, a digital picture recorder, a digital picture player, a digital video recorder, a digital video player and the like.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A semiconductor device comprising:
   an SRAM cell including a first pull-up transistor, a first pull-down transistor and a first pass transistor disposed on a substrate;
   a first read buffer transistor connected to gate terminals of the first pull-up transistor and the first pull-down transistor, the first read buffer transistor including:
      a first channel pattern extending in a first direction vertical to an upper surface of the substrate;
      a first gate electrode covering a part of the first channel pattern; and
      a first drain pattern as a drain terminal of the first read buffer transistor, the first drain pattern spaced apart from the first gate electrode, extended in the first direction, and connected electrically to the first channel pattern; and
   a second read buffer transistor having the first drain pattern as a drain terminal of the second read buffer transistor.

2. The semiconductor device of claim 1,
   wherein the first read buffer transistor and the second read buffer transistor share the first drain pattern as the drain terminal of the first read buffer transistor and the drain terminal of the second read buffer transistor.

3. The semiconductor device of claim 1,
   wherein the second read buffer transistor includes:
      a second channel pattern which extends in the first direction and connected electrically to the first drain pattern; and
      a second gate electrode covering a part of the second channel pattern.

4. The semiconductor device of claim 3,
   wherein a length of the first gate electrode measured in the first direction and a length of the second gate electrode measured in the first direction are different from each other.

5. The semiconductor device of claim 3,
   wherein a width of the first channel pattern and a width of the second channel pattern are different from each other.

6. The semiconductor device of claim 1,
   wherein the first read buffer transistor is disposed at one side of the first drain pattern,
   wherein the second read buffer transistor is disposed at the other side of the first drain pattern, and
   wherein the first read buffer transistor and the second read buffer transistor face each other across the first drain pattern.

7. The semiconductor device of claim 6,
   wherein the first gate electrode of the first read buffer transistor extends in a second direction intersecting the first direction, and
   wherein the first read buffer transistor and the second read buffer transistor are arranged along a straight line extending in the second direction.

8. The semiconductor device of claim 1,
   wherein the first read buffer transistor and the second read buffer transistor are disposed at one side of the first drain pattern.

9. The semiconductor device of claim 8,
   wherein the second read buffer transistor includes:
      a second channel pattern extending in the first direction;
      a second gate electrode covering a part of the second channel pattern; and
      a second conductive region connecting electrically the second channel pattern to the first drain pattern,
   wherein the second gate electrode extends in a second direction intersecting the first direction, and
   wherein the first channel pattern and the second channel pattern arranged in a third direction vertical to both the first direction and the second direction.

* * * * *